United States Patent
Tanabe et al.

(10) Patent No.: US 8,614,483 B2
(45) Date of Patent: Dec. 24, 2013

(54) INSULATED GATE SEMICONDUCTOR DEVICE

(75) Inventors: Hiromitsu Tanabe, Nukata-gun (JP); Yukio Tsuzuki, Nukata-gun (JP); Kenji Kouno, Gifu (JP); Tomofusa Shiga, Nukata-gun (JP)

(73) Assignee: DENSO CORPORATION, Kariya (JP)

( * ) Notice: Subject to any disclaimer, the term of this patent is extended or adjusted under 35 U.S.C. 154(b) by 18 days.

(21) Appl. No.: 13/313,050

(22) Filed: Dec. 7, 2011

(65) Prior Publication Data

US 2012/0146091 A1 Jun. 14, 2012

(30) Foreign Application Priority Data

Dec. 8, 2010 (JP) ................................. 2010-273569
Nov. 17, 2011 (JP) ................................. 2011-251427

(51) Int. Cl.
*H01L 29/66* (2006.01)

(52) U.S. Cl.
USPC ............................ 257/331; 257/329; 257/139

(58) Field of Classification Search
USPC ......... 438/585, 229, 292, 197, 308, 135, 151; 257/E21.444, E21.384, E29.021, 257/E29.027, 369, 410, 632, 347, 133, 135, 257/137, 138, 144, 152, 333, 409
See application file for complete search history.

(56) References Cited

U.S. PATENT DOCUMENTS

| | | | |
|---|---|---|---|
| 5,329,142 A | 7/1994 | Kitagawa et al. | |
| 5,360,984 A | 11/1994 | Kirihata | |
| 5,448,083 A * | 9/1995 | Kitagawa et al. | 257/139 |
| 5,894,149 A | 4/1999 | Uenishi et al. | |
| 6,518,629 B1 | 2/2003 | Kushida et al. | |
| 7,638,839 B2 * | 12/2009 | Arai et al. | 257/331 |
| 2002/0153558 A1 * | 10/2002 | Takemori et al. | 257/330 |
| 2004/0041171 A1 | 3/2004 | Ogura et al. | |
| 2004/0207009 A1 * | 10/2004 | Yamaguchi et al. | 257/329 |
| 2005/0045960 A1 | 3/2005 | Takahashi | |
| 2008/0099837 A1 * | 5/2008 | Akiyama et al. | 257/341 |

FOREIGN PATENT DOCUMENTS

| | | | |
|---|---|---|---|
| JP | A-06-196705 | | 7/1994 |
| JP | A-09-116152 | | 5/1997 |
| JP | A-10-294461 | | 11/1998 |
| JP | 2004221370 A | * | 8/2004 |
| JP | A-2004-221370 | | 8/2004 |

OTHER PUBLICATIONS

Office Action mailed Jul. 23, 2013 in corresponding JP patent application No. 2011-251427 (and English translation).

* cited by examiner

*Primary Examiner* — Yu-Hsi D Sun
*Assistant Examiner* — Christina Sylvia
(74) *Attorney, Agent, or Firm* — Posz Law Group, PLC

(57) ABSTRACT

An insulated gate semiconductor device includes a first conductivity-type semiconductor substrate, a second conductivity-type base layer on a first surface side of the substrate, a trench dividing the base layer into channel and floating layers, and a first conductivity-type emitter region that is formed in the channel layer and in contact with the trench. The semiconductor device includes a gate insulation layer in the trench, a gate electrode on the insulation layer, an emitter electrode electrically connected to the emitter region and the floating layer, a second conductivity-type collector layer in the substrate, and a collector electrode on the collector layer. The floating layer has a lower impurity concentration than the channel layer. The floating layer has a first conductivity-type hole stopper layer located at a predetermined depth from the first surface of the substrate and at least partially spaced from the insulation layer.

33 Claims, 23 Drawing Sheets

INSULATED GATE SEMICONDUCTOR DEVICE

CROSS REFERENCE TO RELATED APPLICATION

This application is based on and incorporates herein by reference Japanese Patent Application No. 2010-273569 filed on Dec. 8, 2010 and No. 2011-251427 filed on Nov. 17, 2011, the contents of which are incorporated by reference.

FIELD OF INVENTION

The present invention relates to an insulated gate semiconductor device.

BACKGROUND OF INVENTION

For example, JP-A-2004-221370 discloses a semiconductor device having an IGBT element. Specifically, in JP-A-2004-221370, a P-type body region is formed on a surface part of an N-type drift region, and multiple trenches that reach the drift region by penetrating the body region. A gate insulation layer is formed on a wall surface of the trench, and a gate electrode is formed on the gate insulation layer.

The P-type body region is divided into multiple semiconductor regions by the trenches. In one semiconductor region, the P-type body region, a $P^+$-type emitter region, and an $N^+$-type emitter region are formed. In the other semiconductor region, the P-type body region, the $P^+$-type emitter region, and an N-type hole stopper layer are formed. The hole stopper layer is separated from and is not contact with two trenches that form the other semiconductor region. A portion of the body region is located between the hole stopper layer and the trench.

Further, an interlayer insulator is formed to cover the trench, and an emitter electrode is formed to cover the interlayer insulator. Thus, the emitter electrode is in contact with the emitter region of each semiconductor region.

In such a structure, in the other semiconductor region, during ON operation of the IGBT element, electrons accumulate between the gate insulation layer and the hole stopper layer so that an inversion layer can be formed. Thus, the flow of holes accumulating in the drift region to the emitter electrode is reduced by the hole stopper layer. During OFF operation of the IGBT element, the electrons accumulating between the gate insulation layer and the hole stopper layer disappear so that the hole in the drift region can flow to the emitter electrode.

In the above conventional technique, a floating effect in the other semiconductor region is enhanced by increasing an impurity concentration in the hole stopper layer so that a carrier accumulation effect of the IGBT element can be increased. However, when the impurity concentration in the hole stopper layer is increased in order merely to increase the carrier accumulation effect, a trade-off between surge and loss of an IGBT and a breakdown resistance (e.g., Reverse bias safe operation area (RBSOA)) become concern.

SUMMARY OF INVENTION

In view of the above, it is an object of the present invention to provide an insulated gate semiconductor device having a structure for reducing a switching loss, a conduction loss, and noise of an IGBT while maintaining a breakdown resistance.

According to a first aspect of the present invention, an insulated gate semiconductor device includes a first conductivity-type semiconductor substrate, a second conductivity-type base layer formed on a first surface side of the semiconductor substrate, and a trench that penetrates the base layer and reaches the semiconductor substrate to divide the base layer into a first base layer and a second base layer. The trench has a predetermined longitudinal direction. The insulated gate semiconductor device further includes a first conductivity-type emitter region formed in the first base layer and in contact with a side surface of the trench in the first base layer, a gate insulation layer formed on a surface of the trench, a gate electrode formed on the gate insulation layer in the trench, an emitter electrode electrically connected to the emitter region, a second conductivity-type collector layer formed in the semiconductor substrate, and a collector electrode formed on the collector layer. The first base layer, where the emitter region is formed, serves as a channel layer. The second base layer, where the emitter region is not formed, serves as a floating layer. The emitter electrode is electrically connected to both the emitter region and the floating layer. An impurity concentration of the floating layer is lower than an impurity concentration of the channel layer. The floating layer has a first conductivity hole stopper layer that is located at a predetermined depth from the first surface of the semiconductor substrate and separated from the first surface of the semiconductor substrate. The hole stopper layer is at least partially spaced from the gate insulation layer.

According to a second aspect of the present invention, an insulated gate semiconductor device includes a first conductivity-type semiconductor substrate, a second conductivity-type base layer formed on a first surface side of the semiconductor substrate and configured to serve as a channel, and a trench that penetrates the base layer and reaches the semiconductor substrate to divide the base layer into multiple base layers. The trench has a predetermined longitudinal direction. The insulated gate semiconductor device further includes a first conductivity-type emitter region formed in part of the base layers and in contact with a side surface of the trench in the first base layer, a gate insulation layer formed on a surface of the trench, a gate electrode formed on the gate insulation layer in the trench, an emitter electrode electrically connected to the emitter region, a second conductivity-type collector layer formed in the semiconductor substrate, and a collector electrode formed on the collector layer. The base layer includes a second conductivity-type upper layer, a second conductivity-type lower layer, and a first conductivity-type hole stopper layer. The upper layer is located on the first surface side of the semiconductor substrate. The emitter region is formed in the upper layer. The lower layer is located under the upper layer and has a lower impurity concentration than the upper layer. The hole stopper layer is formed in the lower layer at a predetermined depth from an interface between the upper layer and the lower layer and at least partially spaced from the gate insulation layer.

According to a third aspect of the present invention, an insulated gate semiconductor device includes a first conductivity-type semiconductor substrate, a second conductivity-type base layer formed on a first surface side of the semiconductor substrate and configured to serve as a channel, and a trench that penetrates the base layer and reaches the semiconductor substrate to divide the base layer into multiple base layers. The trench has a predetermined longitudinal direction. The insulated gate semiconductor device further includes a first conductivity-type emitter region formed in part of the base layers and in contact with a side surface of the trench in the first base layer, a gate insulation layer formed on a surface of the trench, a gate electrode formed on the gate insulation layer in the trench, an emitter electrode electrically connected to the emitter region, a second conductivity-type collector layer formed in the semiconductor substrate, and a collector electrode formed on the collector layer. The base layer includes a second conductivity-type upper layer, a first conductivity-type middle layer, a second conductivity-type lower layer, and a first conductivity-type hole stopper layer. The upper layer is located on the first surface side of the semiconductor substrate. The emitter region is formed in the upper layer. The middle layer is located under the upper layer. The hole stopper layer is formed under the middle layer, has a higher impurity concentration than the middle layer, and at least partially spaced from the gate insulation layer. The lower layer is located under the upper layer and has a lower impurity concentration than the upper layer.

BRIEF DESCRIPTION OF THE DRAWINGS

The above and other objects, features, and effects will become more apparent from the following description and drawings. In the drawings:

FIG. 7 is a diagram illustrating a switching waveform when an IGBT is turned ON;

DETAILED DESCRIPTION OF THE PREFERRED EMBODIMENTS

Figure 1:
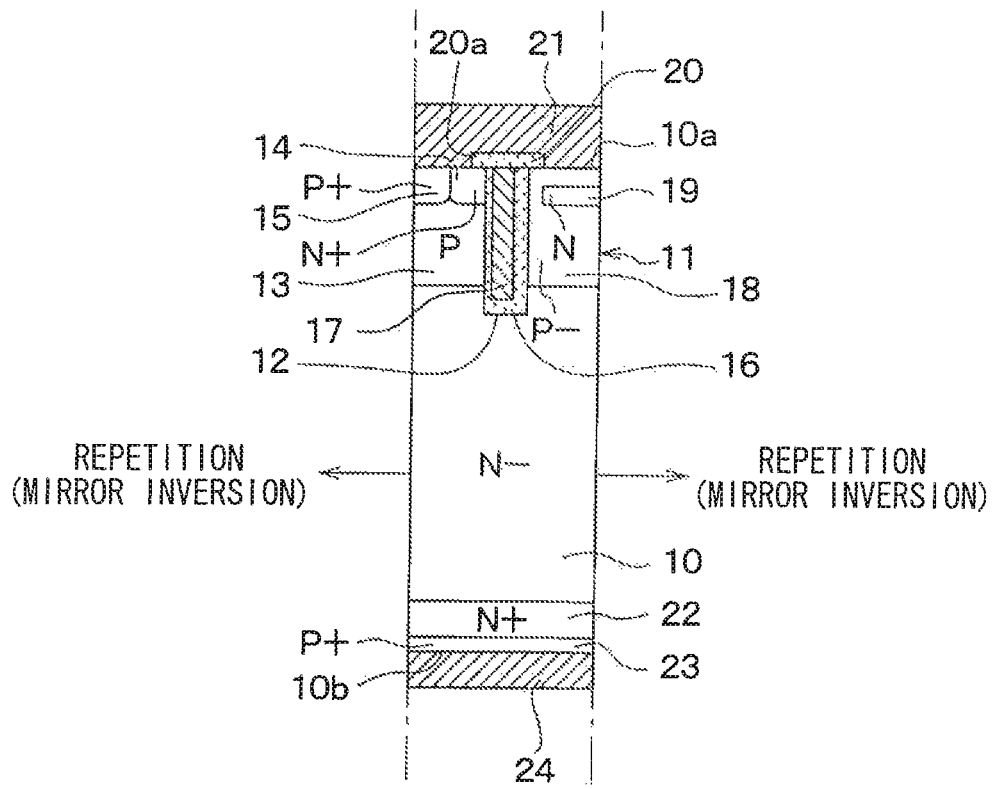
FIG. 1 is a partial cross-sectional view of an insulated gate semiconductor device according to a first embodiment of the present invention.

Embodiments of the present invention are described below with reference to the drawings in which like reference numerals depict like elements. In the embodiments, N-type, N$^-$-type, and N$^+$-type correspond to a first conductivity-type in the present invention, and P-type, P$^-$-type, and P$^+$-type correspond to a second conductivity-type in the present invention.

First Embodiment

A first embodiment of the present invention is described below with reference to the drawings. An insulated gate semiconductor device according to the present embodiment is employed as a power switching element used in a power circuit such as an inverter or a DC/DC converter.

FIG. 1 is a partial cross-sectional view of the insulated gate semiconductor device according to the present embodiment. As shown in this figure, a P-type base layer 11 having a predetermined thickness is formed on a first surface 10a side of an N$^-$-type semiconductor substrate 10 that serves as a drift layer. Further, multiple trenches 12 that reach the semiconductor substrate 10 by penetrating the base layer 11 are formed. The base layer 11 is divided into multiple portions by the trenches 12. Some of the portions of the base layer 11 are of P$^-$-type. That is, the base layer 11 has a P-type region and a P$^-$-type region so that there can be two regions with different impurity concentrations in the base layer 11.

The trench 12 has a longitudinal direction parallel to the first surface 10a of the semiconductor substrate 10. For example, the trenches 12 can be arranged at a regular interval and extend parallel to each other in the longitudinal direction.

The base layer 11 located between adjacent trenches 12 (i.e., base layer 11 that is not surrounded by a ring-shaped trench 12) serves as a P-type channel layer 13 that forms a channel region. An N$^+$-type emitter region 14 is formed on a surface part of the channel layer 13. Further, in the channel layer 13, a P$^+$-type body region 15 is formed on an upper layer of the channel layer 13 and located between the emitter regions 14.

An impurity concentration of the N$^+$-type emitter region 14 is higher than an impurity concentration of the N$^-$-type semiconductor substrate 10. The N$^+$-type emitter region 14 is terminated in the base layer 11 and in contact with a side surface of the trench 12. In contrast, an impurity concentration of the P$^+$-type body region 15 is higher than an impurity concentration of the P-type channel layer 13. Like the emitter region 14, the P$^+$-type body region 15 is terminated in the base layer 11.

Specifically, the emitter region 14 is located between the trenches 12 and extends along the longitudinal direction of the trench 12. The emitter region 14 is shaped like a rod and in contact with the side surface of the trench 12. The emitter region 14 is terminated inside an end of the trench 12. The body region 15 is located between two emitter regions 14 and extends along the longitudinal direction of the trench 12 (i.e., emitter region 14). The body region 15 is shaped like a rod.

Each trench 12 is filled with a gate insulation layer 16 and a gate electrode 17 so that a trench gate structure can be formed. The gate insulation layer 16 is formed on an inner wall surface of the trench 12, and the gate electrode 17 is formed on the gate insulation layer 16. For example, the gate electrode 17 can be made of N-type polysilicon. The gate electrode 17 extends along the longitudinal direction of the trench 12 and is connected to a wiring member, which is not shown in the figure.

The base layer 11 that is surrounded by the ring-shaped trench 12, i.e., the base layer 11 in which the emitter region 14 is not formed serves as a P$^-$-type floating layer 18. An impurity concentration of the P$^-$-type floating layer 18 is lower than the impurity concentration of the channel layer 13. For example, the impurity concentration of the channel layer 13 can be 2×10$^{17}$/cm$^3$, and the impurity concentration of the P$^-$-type floating layer 18 can be 1×10$^{16}$/cm$^3$.

As described above, the base layer 11 is divided by the trenches 12. The base layer 11 in which the emitter region 14 is formed serves as the channel layer 13, and the base layer 11 in which the emitter region 14 is not formed serves as the floating layer 18. The emitter region 14 is alternately formed in the divided base layers 11 so that the channel layer 13 and the floating layer 18 can be arranged in a predetermined pattern, i.e., alternately and repeatedly arranged.

The gate insulation layer 16 formed on the side surface of the trench 12 has a first portion and a second portion. The first portion of the gate insulation layer 16 is in contact with the floating layer 18, and the second portion of the gate insulation layer 16 is in contact with the channel layer 13. A thickness of the first portion of the gate insulation layer 16 is different from a thickness of the second portion of the gate insulation layer 16. Specifically, according to the present embodiment, for example, one floating layer 18 is located between adjacent channel layers 13. The first portion of the gate insulation layer 16 is formed on the side surface of the trench 12, which separates the floating layer 18 from one channel layer 13, and in contact with the floating layer 18. The second portion of the gate insulation layer 16 is formed on the side surface of the trench 12, which separates the floating layer 18 from the one channel layer 13, and in contact with the channel layer 13. Likewise, the first portion of the gate insulation layer 16 is formed on the side surface of the trench 12, which separates the floating layer 18 from the other channel layer 13, and in contact with the floating layer 18. The second portion of the gate insulation layer 16 is formed on the side surface of the trench 12, which separates the floating layer 18 from the other channel layer 13, and in contact with the channel layer 13. The first portion of the gate insulation layer 16 in contact with the floating layer 18 is thicker than the second portion of the gate insulation layer 16 in contact with the channel layer 13.

Thus, the thickness of the gate insulation layer 16 formed in one trench 12 is different between on the channel layer 13 side and on the floating layer 18 side, and the gate insulation layer 16 in contact with the floating layer 18 is thicker than the gate insulation layer 16 in contact with the channel layer 13.

An N-type hole stopper layer 19 is formed in the floating layer 18 of the base layer 11 at a predetermined depth from the first surface 10a of the semiconductor substrate 10 and spaced from the first surface 10a of the semiconductor substrate 10. That is, the floating layer 18 is partially located between the first surface 10a of the semiconductor substrate 10 and the hole stopper layer 19. In the base layer 11, the hole stopper layer 19 is formed only in the floating layer 18 and is not formed in the channel layer 13. The hole stopper layer 19 is located closer to a surface of the floating layer 18 in a depth direction of the trench 12. For example, an impurity concentration of the hole stopper layer 19 can be about $1 \times 10^{18}/cm^3$.

The hole stopper layer 19 is in contact with neither the gate insulation layer 16 formed on the side surface of the trench 12, which separates the floating layer 18 from one channel layer 13, nor the gate insulation layer 16 formed on the side surface of the trench 12, which separates the floating layer 18 from the other channel layer 13. That is, the hole stopper layer 19 is formed in the floating layer 18 in such a manner that end portions of the hole stopper layer 19 is spaced from the gate insulation layer 16 by a predetermined separation distance. The separation distance is determined based on widths of an inversion layer and a depletion layer that are formed in the floating layer 18 when a gate voltage is applied to the gate electrode 17. For example, the separation distance can be 100 nm or less, preferably 30 nm or less.

Further, an interlayer insulator 20 such as BPSG is formed on the base layer 11. A contact hole 20a is formed in the interlayer insulator 20, and a portion of the $N^+$-type emitter region 14, the $P^+$-type body region 15, and the floating layer 18 are exposed to the outside of the interlayer insulator 20. The emitter electrode 21 is formed on the interlayer insulator 20 and electrically connected through the contact hole 20a to the $N^+$-type emitter region 14, the $P^+$-type body region 15, and the floating layer 18. In other words, the emitter electrode 21 is electrically connected to both the emitter region 14 and the floating layer 18.

An $N^+$-type field stop layer 22 is formed on a second surface 10b side of the $N^-$-type semiconductor substrate 10. The second surface 10b is opposite to the first surface 10a. A $P^+$-type collector layer 23 is formed on the field stop layer 22, and a collector electrode 24 is formed on the collector layer 23.

Figure 2:
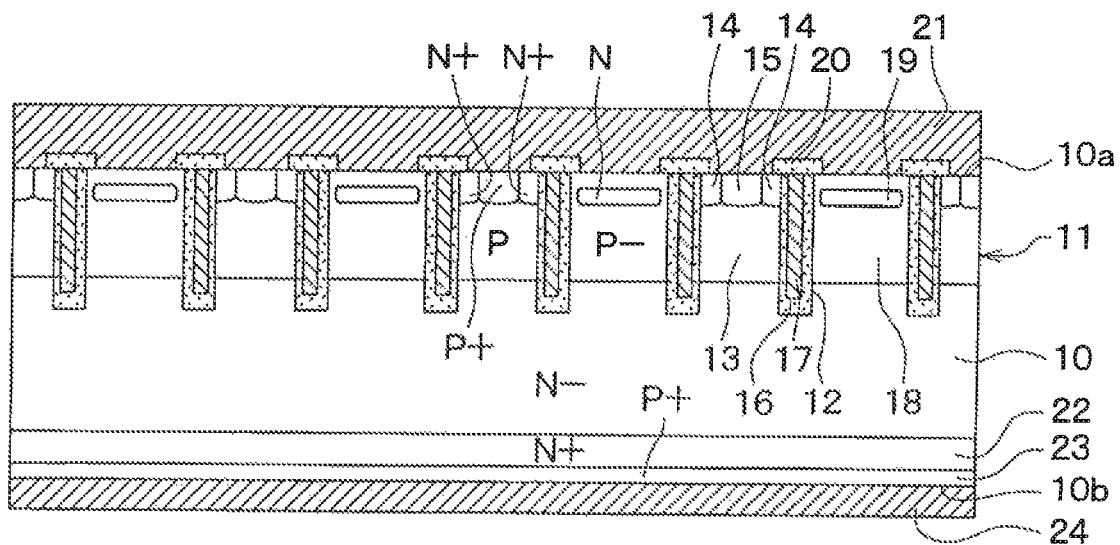
FIG. 2 is a cross-sectional view obtained by repeating a minimum basic structure shown in FIG. 1 in a mirror-like fashion.

FIG. 2 is a cross-sectional view obtained by repeating a minimum basic structure shown in FIG. 1 in a mirror-like fashion. An area between the emitter electrode 21 and the collector electrode 24, where a current flows in the channel layer 13, acts as an IGBT. An area having a channel constructed with a portion of the floating layer 18 between the gate insulation layer 16 and the hole stopper layer 19 between the emitter electrode 21 and the collector electrode 24 acts as a MOSFET. The MOSFET is a depletion type and turned OFF when the gate voltage becomes 15V, for example.

In this way, in the semiconductor substrate 10, the IGBT and a dummy element (MOSFET) are alternately arranged. That is, the insulated gate semiconductor device according to the present embodiment has a spaced IGBT element.

As described above, the first portion of the gate insulation layer 16 in contact with the floating layer 18 is thicker than the second portion of the gate insulation layer 16 in contact with the channel layer 13. Therefore, a threshold Vt2 of the MOSFET is higher than a threshold Vt1 of the IGBT. For example, the threshold Vt1 of the IGBT is about 6V, and the threshold Vt2 of the MOSFET is in a range from about 12V to about 15V, which is higher than a large current Vth of a driving current of the IGBT and lower than a voltage applied to the gate electrode 17 when the IGBT is ON. Up to this point, the structure of the insulated gate semiconductor device according to the present embodiment is described.

Next, a method of manufacturing the insulated gate semiconductor device is described. Firstly, an $N^-$-type wafer is prepared, and a P-type region and a $P^-$-type region are formed as the base layer 11 on a front surface side of the wafer. For example, after the $P^-$-type region is formed on the front surface side of the wafer, the P-type region is formed by ion implantation using a mask or the like. Alternatively, the P-type region and the $P^-$-type region can be formed separately by using a mask.

Then, the trench gate structure is formed in the wafer. A method of manufacturing the trench gate structure is the same as a conventional method and not described in detail. The trench 12 is formed so that it can penetrate the base layer 11 and reach the semiconductor substrate 10. The gate insulation layer 16 and polysilicon as the gate electrode 17 are formed on the inner wall surface of the trench 12. It is noted that the gate insulation layer 16 is formed in such a manner that the thickness of the gate insulation layer 16 on the side surface of the trench 12 is different between the channel layer 13 side and the floating layer 18 side.

Next, a mask having an opening at a position where the $N^+$-type emitter region 14 is to be formed is placed on the wafer, and ion implantation of N-type impurities is performed by using the mask. Then, after the mask is removed, a new mask having an opening at a position where the $P^+$-type body region 15 is to be formed is placed on the wafer, and ion implantation of P-type impurities is performed by using the new mask. Then, after the new mask is removed, an annealing process is done to activate the implanted impurities so that the $N^+$-type emitter electrode 21 and the $P^+$-type body region 15 can be formed.

Next, the hole stopper layer 19 is formed in a region of the base layer 11, where the floating layer 18 is to be formed, by ion implantation using a mask and by an annealing process. For example, phosphorus (P) as a dopant is ion-implanted and activated by the annealing process at 900° C. or more. Thus, the hole stopper layer 19 is formed in the floating layer 18.

Then, the interlayer insulator 20 is formed on the base layer 11, and the contact hole 20a is formed in the interlayer insulator 20 so that the portion of the $N^+$-type emitter region 14, the $P^+$-type body region 15, and the floating layer 18 can be exposed. Thus, the emitter electrode 21 and the floating layer 18 can be electrically connected. It is noted that the wiring member, which is not shown in the figure, is formed at the same time as the emitter electrode 21.

Further, the N-type field stop layer 22 is formed on a back surface side of the wafer, and the P-type collector layer 23 is formed on the field stop layer 22. Then, the collector electrode 24 is formed on the collector layer 23, and the wafer is cut into individual die. Thus, the insulated gate semiconductor device is completed.

Figure 3:
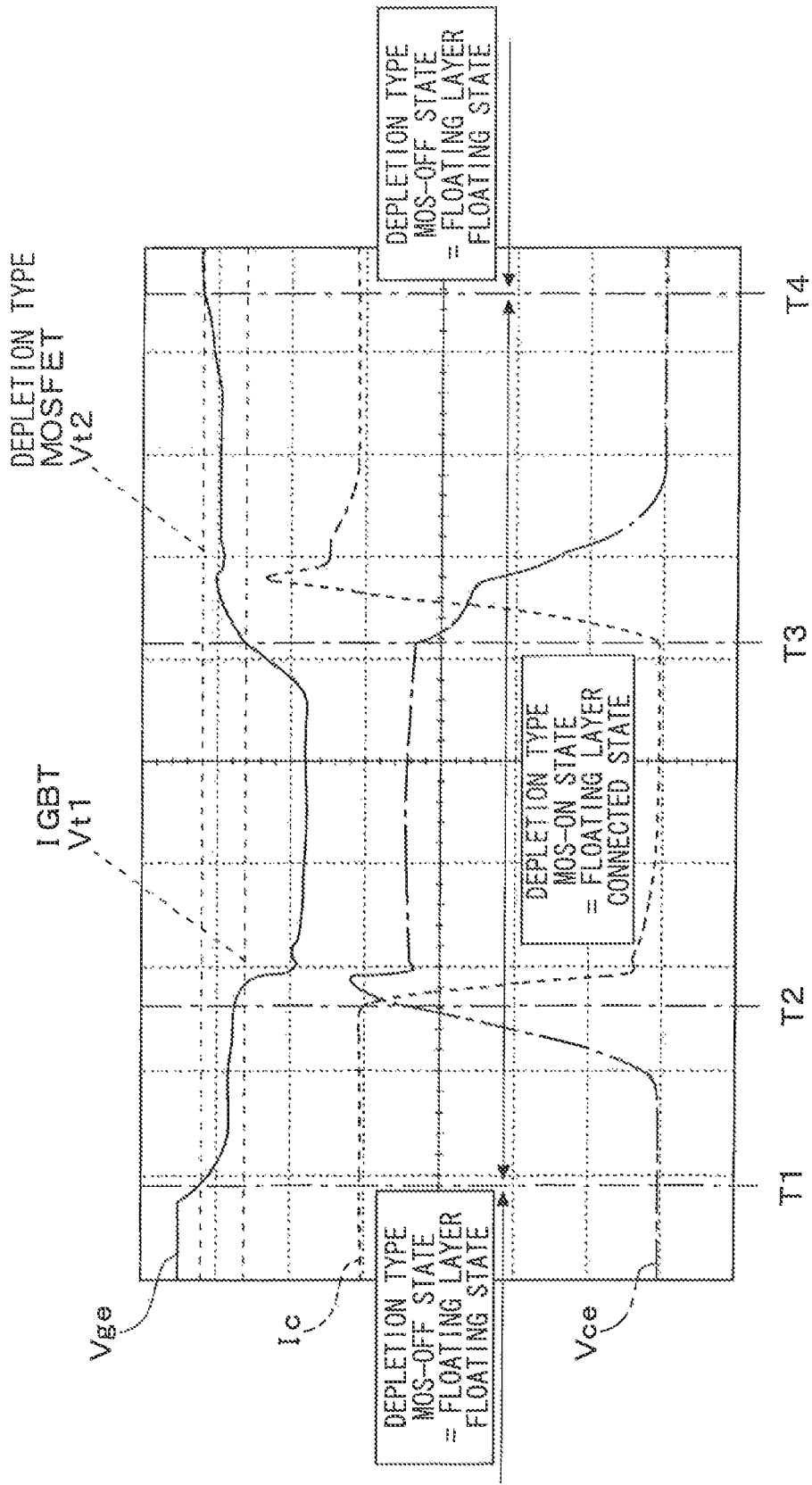
FIG. 3 is a diagram illustrating an operation waveform of the insulated gate semiconductor device.

Next, an operation of the insulated gate semiconductor device is described with reference to FIG. 3. FIG. 3 is a diagram illustrating an operation waveform of the insulated gate semiconductor device. The waveform shown in FIG. 3 is measured under conditions where a voltage of, for example, 650V is applied to the collector of the insulated gate semiconductor device as a sample for evaluation, the emitter is connected to ground, and the gate voltage is applied to the gate electrode 17.

In FIG. 3, the horizontal axis represents time, and the vertical axis represents voltage or current. Vge is an emitter-gate voltage, i.e., the gate voltage. Ic is a collector current flowing from the collector to the emitter. Vce is a collector-emitter voltage, i.e., the collector voltage.

As shown in FIG. 3, the depletion type MOSFET is OFF, when the gate voltage Vge is higher than the threshold voltage Vt2 of the MOSFET. That is, the inversion layer is formed between the gate insulation layer 16 and the hole stopper layer 19 in the floating layer 18. Thus, the inversion layer and the hole stopper layer 19 serve as a potential wall for reducing the flow of holes to the floating layer 18. As a result, the holes accumulate in the semiconductor substrate 10 so that an ON-voltage of the IGBT can be reduced.

When the gate voltage Vge decreases below the threshold voltage Vt2 at a time T1, the MOSFET is turned ON. That is, the inversion layer formed in the floating layer 18 disappears so that the floating layer 18 can be connected to the emitter electrode 21. Thus, before the IGBT is turned OFF, the holes accumulating in the semiconductor substrate 10 can be discharged to the emitter electrode 21 through the space between the gate insulation layer 16 and the hole stopper layer 19. Therefore, a switching speed of the IGBT can be increased so that a switching loss can be reduced. A transition period is from the time t1 to a time t2 at which the gate voltage Vge decreases below the threshold voltage Vt1 of the IGBT.

During the transition period from the time T1 to the time T2, the collector current Ic is constant, but the collector voltage Vce starts to increase.

When the gate voltage Vge decreases below the threshold voltage Vt1 of the IGBT at the time T2, the IGBT is turned OFF so that the collector current Ic flowing in the insulated gate semiconductor device can gradually decrease to zero. The collector voltage Vce surges a little and then becomes constant.

Then, the gate voltage Vge starts to increase. When the gate voltage Vge exceeds the threshold voltage Vt1 of the IGBT at a time T3, the IGBT is turned ON so that the collector current Ic can start to flow. The collector current Ic overshoots a little and then becomes constant. Since the collector current Ic flows to start when the IGBT is turned ON, the collector voltage Vce decreases.

After the time T3, the gate voltage Vge does not exceed the threshold voltage Vt2 of the MOSFET. Therefore, the inversion layer is not formed in the floating layer 18 so that the floating layer 18 can remain connected to the emitter electrode 21.

Then, the depletion type MOSFET is turned OFF at a time T4, because the gate voltage Vge exceeds the threshold voltage Vt2 of the MOSFET. Thus, the inversion layer is formed between the gate insulation layer 16 and the hole stopper layer 19 in the floating layer 18 so that the hole accumulation effect can be exerted. After the time T4, the waveform returns to the time T1 so that the ON and OFF operation of the IGBT can be repeated.

Regarding an insulated gate semiconductor device that operates in the above manner, the present inventors performed a simulation to evaluate switching waveforms, static characteristics, and ON/OFF switching waveforms of an IGBT of a conventional structure and the present embodiment's structure. A result of the simulation is shown in FIGS. 4-8B.

In these figures, "conventional" represents the conventional structure in which the gate insulation layer 16 formed on the surface of the trench has a uniform thickness. In contrast, "Vt large" represents the present embodiment's structure in which the gate insulation layer 16 in contact with the floating layer 18 is thicker than the gate insulation layer 16 in contact with the channel layer 13 so that the threshold voltage Vt2 of the MOSFET can be higher than the threshold voltage Vt1 of the IGBT.

Figure 4:
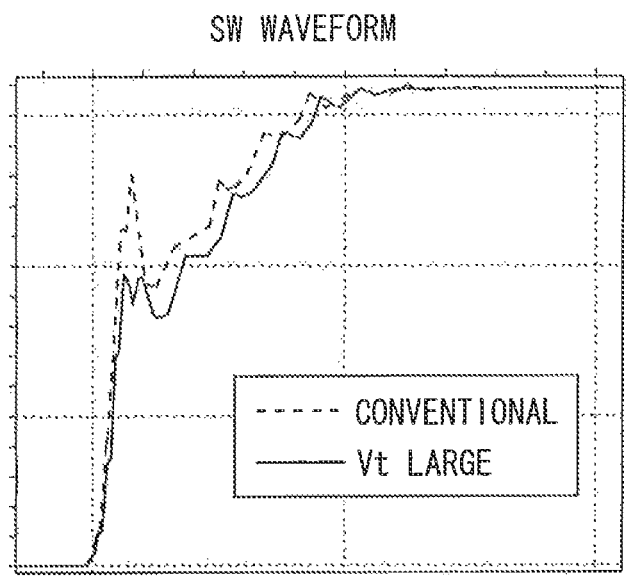
FIG. 4 is a diagram illustrating a switching waveform obtained by the insulated gate semiconductor device.

FIG. 4 is a diagram illustrating the switching waveforms (SW waveform) obtained by the insulated gate semiconductor device. In FIG. 4, the horizontal axis represents time, and the vertical axis represents a voltage applied to a diode element (FWD) connected to a collector of the insulated gate semiconductor device. As shown in FIG. 4, a surge occurring when a voltage waveform rises is smaller in the present embodiment's structure, in which the threshold voltage Vt2 is increased, than in the conventional structure. Thus, the present embodiment's structure reduces noise.

Figure 5:
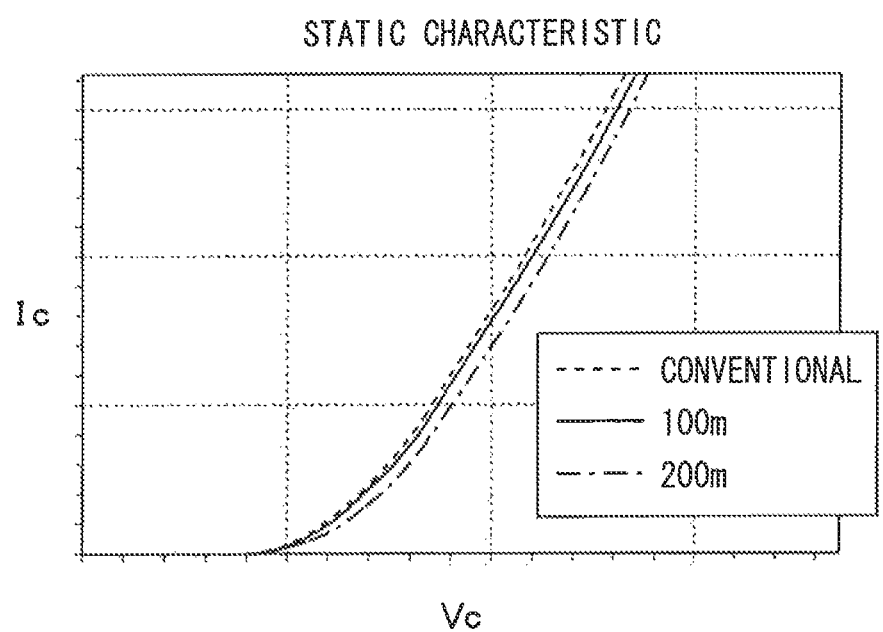
FIG. 5 is a diagram illustrating static characteristics of the insulated gate semiconductor device.

FIG. 5 is a diagram illustrating the static characteristics of the insulated gate semiconductor device. In FIG. 5, the horizontal axis represents a collector voltage (Vc), and the vertical axis represents a collector current (Ic). "100 nm" and "200 nm" represent a separation distance (=Δ) between the gate insulation layer 16 and the hole stopper layer 19 in the floating layer 18. As can be seen from FIG. 5, when the separation distance Δ is 100 nm or less, the ON-voltage can be reduced to a suitable level. It was found out that the high threshold voltage Vt2 of the MOSFET does not have an influence on the static characteristics.

Figure 6:
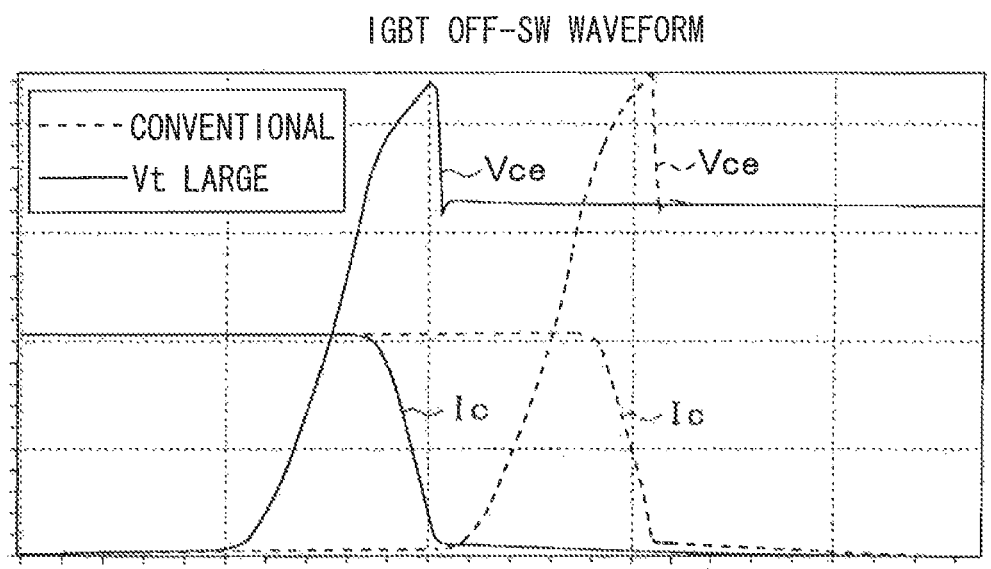
FIG. 6 is a diagram illustrating a switching waveform when an IGBT is turned OFF.

FIG. 6 is a diagram illustrating the switching waveforms when the IGBT is turned OFF and corresponds to, for example, the waveforms of the collector current Ic and the collector voltage Vce around the time T2 in FIG. 3. In FIG. 6, the horizontal axis represents time, and the vertical axis represents the collector current Ic and the collector voltage Vce. From FIG. 6, it appears that the waveforms of the conventional structure and the present embodiment's structure are almost the same. However, the rising speed of the collector voltage Vce is higher in the present embodiment's structure than in the conventional structure. Thus, the present embodiment's structure increases the switching speed and reduces loss.

Figure 7:
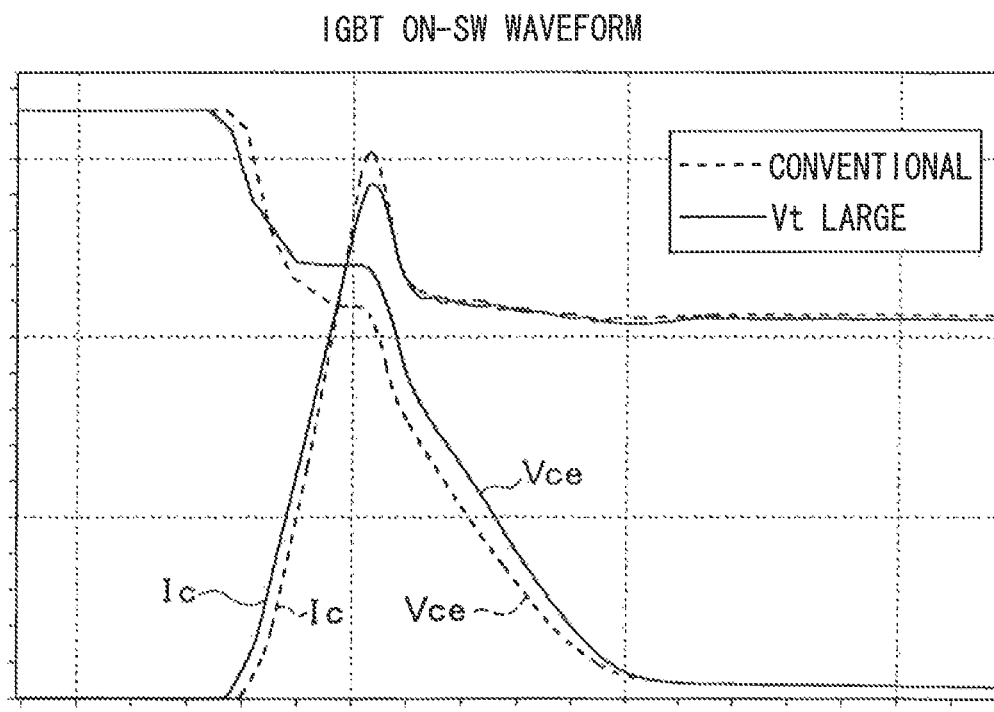

FIG. 7 is a diagram illustrating the switching waveform when the IGBT is turned ON and corresponds to, for example, the waveforms of the collector current Ic and the collector voltage Vce around the time T3 in FIG. 3. In FIG. 7, the horizontal axis represents time, and the vertical axis represents the collector current Ic and the collector voltage Vce. As can be seed from FIG. 7, the rising of the collector current Ic is gentler in the present embodiment's structure than in the conventional structure. Thus, the present embodiment's structure reduces an overshoot in the collector current Ic. Further, it was found out that the falling speed of the collector voltage Vce is higher in the present embodiment's structure than in the conventional structure.

Figure 8A:
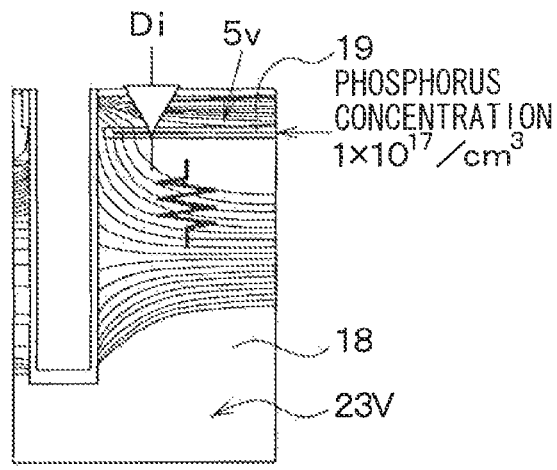
FIGS. 8A and 8B are diagrams illustrating a result of a simulation of a breakdown resistance of a hole stopper layer.
Figure 8B:
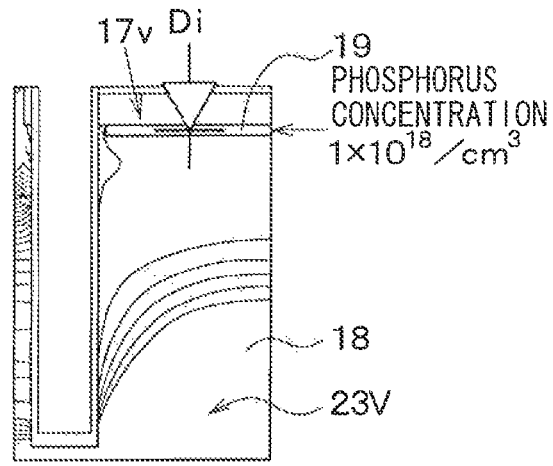

FIGS. 8A and 8B are diagrams illustrating a breakdown resistance of the hole stopper layer. Specifically, FIG. 8A is the result of the simulation performed by setting a concentration of phosphorus to form the hole stopper later 19 to $1 \times 10^{17}$ cm$^3$, and FIG. 8B is the result of the simulation performed by setting the concentration of phosphorus to form the hole stopper later 19 to $1 \times 10^{18}$ cm$^3$.

When diodes (Di) shown in FIGS. 8A and 8B are broken down, a latch up occurs due to electron current injection. If the impurity concentration of the hole stopper layer 19 is low as shown in FIG. 8A, a hole current flows in the floating layer 18. Therefore, even when the collector electrode 24 side of the floating layer 18 is 23V, the emitter electrode 21 side of the floating layer 18 decreases to 5V.

In contrast, if the impurity concentration of the hole stopper layer 19 is high as shown in FIG. 8B, almost no hole current flows in the floating layer 18 so that the voltage decrease due to the electron current can be almost zero. Therefore, when the collector electrode 24 side of the floating layer 18 is 23V, the emitter electrode 21 side of the floating layer 18 is kept at 17V.

That is, the voltage decrease due to the current is smaller, as the phosphorus concentration is higher. Therefore, the voltage applied to the hole stopper layer 19 is increased so that a breakdown can be likely to occur. In summary, although the ON-voltage of the insulated gate semiconductor device can be reduced by enhancing the hole accumulation effect by increasing the impurity concentration of the floating layer 18, the increases in the impurity concentration of the floating layer 18 reduces the breakdown resistance of the semiconductor device. However, according to the present embodiment, the impurity concentration of the P⁻-type floating layer 18 is set lower than that of the channel layer 13 so that the breakdown resistance of the hole stopper layer 19 can be increased. That is, the impurity concentration of the hole stopper layer 19 can be increased while enhancing the breakdown resistance of the semiconductor device. Further, a width of a depletion layer formed in the floating layer 18 can be increased.

As described above, according to the present embodiment, the impurity concentration of the floating layer 18 is lower than the impurity concentration of the channel layer 13. In such an approach, the impurity concentration of the hole stopper layer 19 formed in the floating layer 18 is increased so that the hole accumulation effect of the hole stopper layer 19 can be increased than ever before.

Further, according to the present embodiment, the thickness of the gate insulation layer 16 is controlled so that the threshold voltage Vt2 of the MOSFET can be higher than the threshold voltage Vt1 of the IGBT. In such an approach, before the IGBT is turned ON, the MOSFET is turned ON so that the inversion layer in the floating layer 18 can disappear. Thus, the holes accumulating in the semiconductor substrate 10 are discharged to the emitter electrode 21 through the space between the gate insulation layer 16 and the hole stopper layer 19. Therefore, the switching speed of the IGBT can be increased, and the switching loss and the surge can be reduced.

For the above reasons, the switching loss and noise of the IGBT can be reduced with the hole accumulation effect of the hole stopper layer 19 and the breakdown resistance of the IGBT maintained.

Second Embodiment

Figure 9:
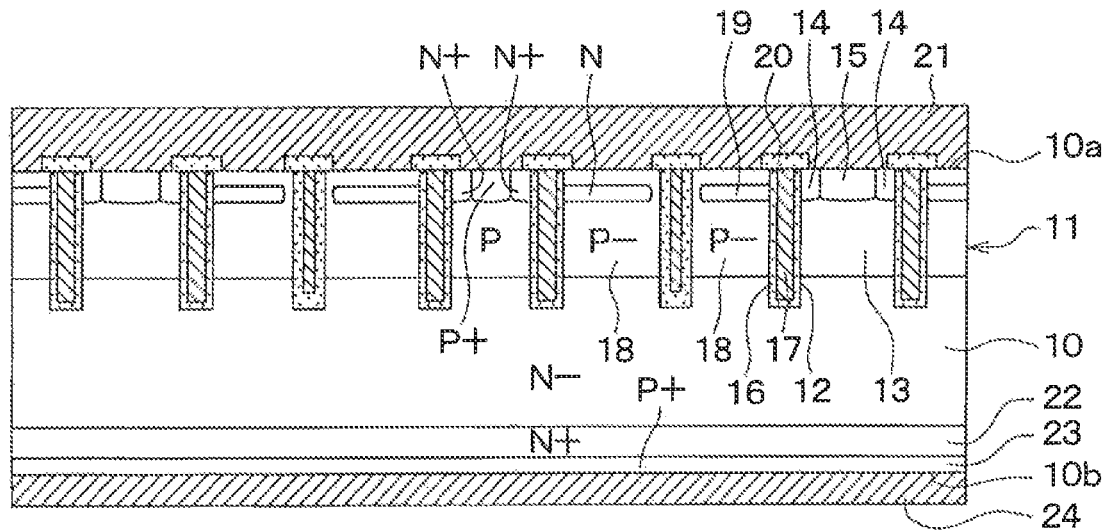
FIG. 9 is a cross-sectional view of an insulated gate semiconductor device according to a second embodiment of the present invention.

A difference of the present embodiment from the first embodiment is as follows. FIG. 9 is a diagram illustrating a cross-sectional view of an insulate gate semiconductor device according to the present embodiment. As shown in this figure, the trenches 12 are formed in such a manner that two floating layers 18 are located adjacent to each other between two channel layers 13. One channel layer 13 is provided for every two floating layers 18 to increase a ratio of the floating layer 18 to the IGBT.

The hole stopper layer 19 is formed in each of the two floating layers 18 between the channel layers 13. The hole stopper layer 19 is in contact with the gate insulation layer 16 formed on the side surface of the trench 12 that separates the channel layer 13 from the floating layer 18. In contrast, the hole stopper layer 19 is not in contact with the gate insulation layer 16 formed on the side surface of the trench 12 that separates one floating layer 18 from the other floating layer 18. That is, two depletion type MOSFETs are located between two channel layers 13.

Further, the thickness of the gate insulation layer 16 formed on the side surface of the trench 12 that separates the channel layer 13 from the floating layer 18 is different from the thickness of the gate insulation layer 16 formed on the side surface of the trench 12 that separates one floating layer 18 from the other floating layer 18. Specifically, the gate insulation layer 16 formed on the side surface of the trench 12 that separates one floating layer 18 from the other floating layer 18 is thicker than the gate insulation layer 16 formed on the side surface of the trench 12 that separates the channel layer 13 from the floating layer 18.

Thus, the threshold Vt2 of the MOSFET in which a current flows in the floating layer 18 can be higher than the threshold Vt1 of the IGBT in which a current flows in the channel layer 13.

Next, a method of forming the hole stopper layer 19 of the insulated gate semiconductor device having the above structure is described with reference to FIGS. 10A-10D and FIGS. 11A-11C. FIGS. 10A-10D and FIGS. 11A-11C are enlarged cross-sectional views of a portion near the boundary between two floating layers 18. It is noted that the base layer 11 is omitted in FIGS. 10A-10D and FIGS. 11A-11C.

Figure 10A:
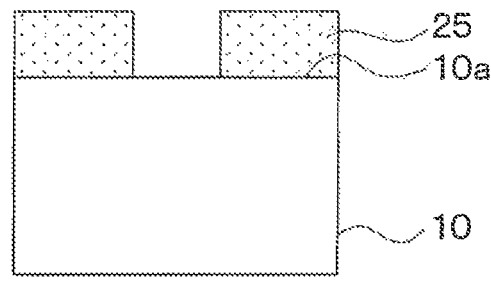
FIGS. 10A-10D are diagrams illustrating forming processes of a hole stopper layer of the insulated gate semiconductor device shown in FIG. 9.

Firstly, in a process shown in FIG. 10A, the semiconductor substrate 10 where the base layer 11 (not shown) is formed is prepared, and an oxide film 25 such as $SiO_2$ is formed on the first surface 10a of the semiconductor substrate 10. Then, an opening is formed in the oxide film 25 at a position where the trench 12 is to be formed.

Figure 10B:
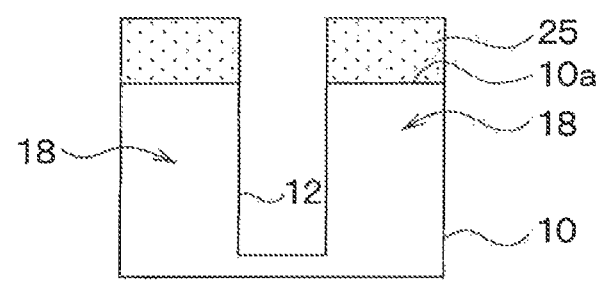

In a process shown in FIG. 10B, the trench 12 is formed in the semiconductor substrate 10 by using the oxide film 25 as a mask. The trench 12 penetrates the base layer 11, which is not shown, and reaches the N⁻-type drift region.

Figure 10C:
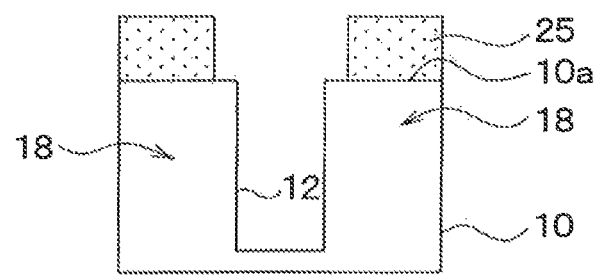

Next, in a process shown in FIG. 10C, the oxide film 25 is wet etched so that the first surface 10a of the semiconductor substrate 10 around an opening of the trench 12 can be exposed.

Figure 10D:
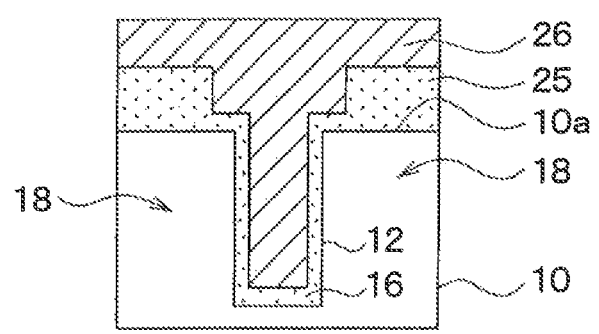

Then, in a process shown in FIG. 10D, the gate insulation layer 16 is formed on the surface of the trench 12, for example, by heating the semiconductor substrate 10 in an atmosphere of oxygen. Then, a polysilicon for the gate electrode 17 is formed on the gate insulation layer 16 by a CVD method or the like.

Figure 11A:
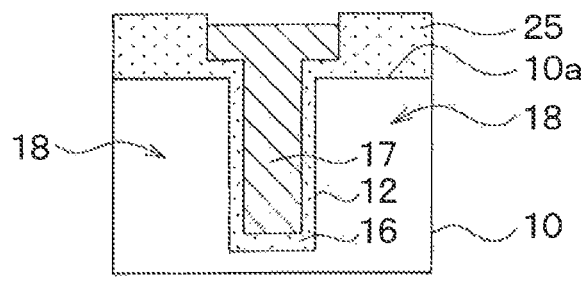
FIGS. 11A-11C are diagrams illustrating forming processes following the forming processes shown in FIGS. 10A-10D.

In a process shown in FIG. 11A, a polysilicon 26 is etched back so that the surface of the oxide film 25 can be exposed. A portion of the polysilicon 26 filling the trench 12 becomes the gate electrode 17.

Figure 11B:
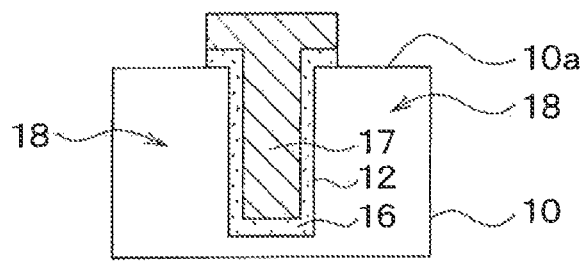
Figure 11C:
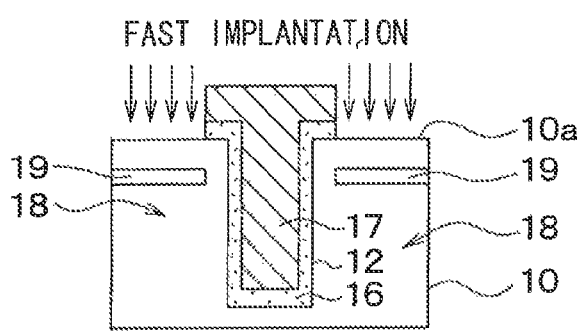

In a process shown in FIG. 11B, the oxide film 25 on the first surface 10a of the semiconductor substrate 10 is removed so that the gate insulation layer 16 and the gate electrode 17 can project from the side surface of the trench 12 in the surface direction of the first surface 10a of the semiconductor substrate 10. Thus, the floating layer 18 on the side surface side of the trench 12 is covered with the gate insulation layer 16 and the gate electrode 17.

Then, in a process shown in FIG. 11B, a fast implantation is applied to the semiconductor substrate 10. Thus, the gate insulation layer 16 and the gate electrode 17 left on the floating layer 18 serve as a mask so that the hole stopper layer 19 can be formed in the floating layer 18 and spaced from the gate insulation layer 16 in a self-aligning manner. In this way, the hole stopper layer 19 can be formed.

As described above, the ratio of the floating layer 18 to the IGBT can be increased.

Third Embodiment

Figure 12:
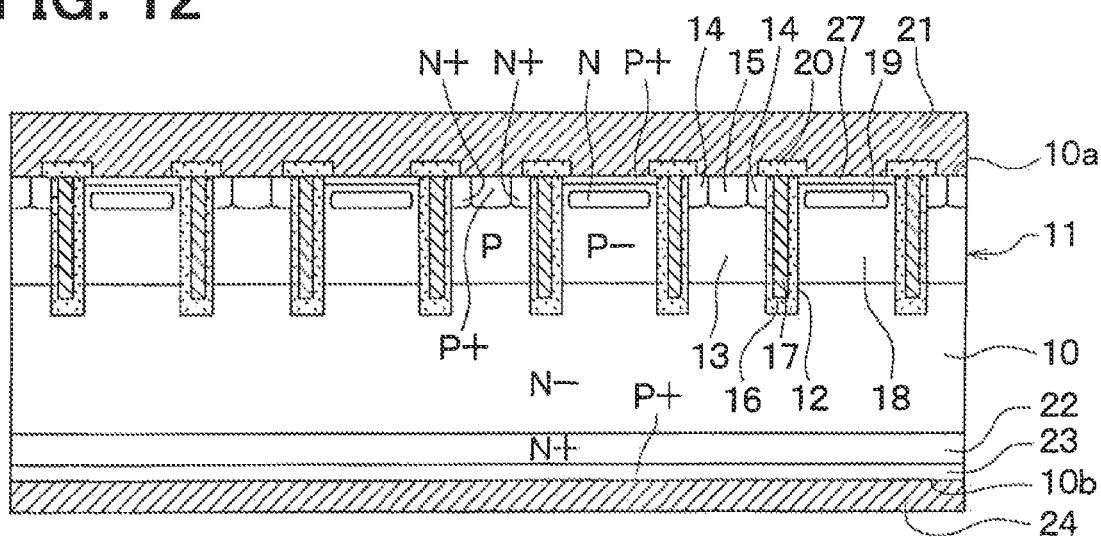
FIG. 12 is a cross-sectional view of an insulated gate semiconductor device according to a third embodiment of the present invention.

A difference of the present embodiment from the first embodiment and the second embodiment is as follows. FIG. 12 is a cross-sectional view of an insulated gate semiconductor device according to the present embodiment. As shown in this figure, a P⁺-type contact layer 27 is formed on an electrode portion (surface portion) of the floating layer 18. An impurity concentration of the contact layer 27 is higher than the impurity concentration of the floating layer 18. The contact layer 27 is formed at a shallow depth not to be in contact with the hole stopper layer 19. The contact layer 27 is in contact with the emitter electrode 21.

Thus, a contact resistance of the floating layer 18 to the emitter electrode 21 can be reduced. Further, a punch through, which can occur when the diode (Di) shown in FIG. 8B is reverse-biased, can be prevented.

Fourth Embodiment

Figure 13:
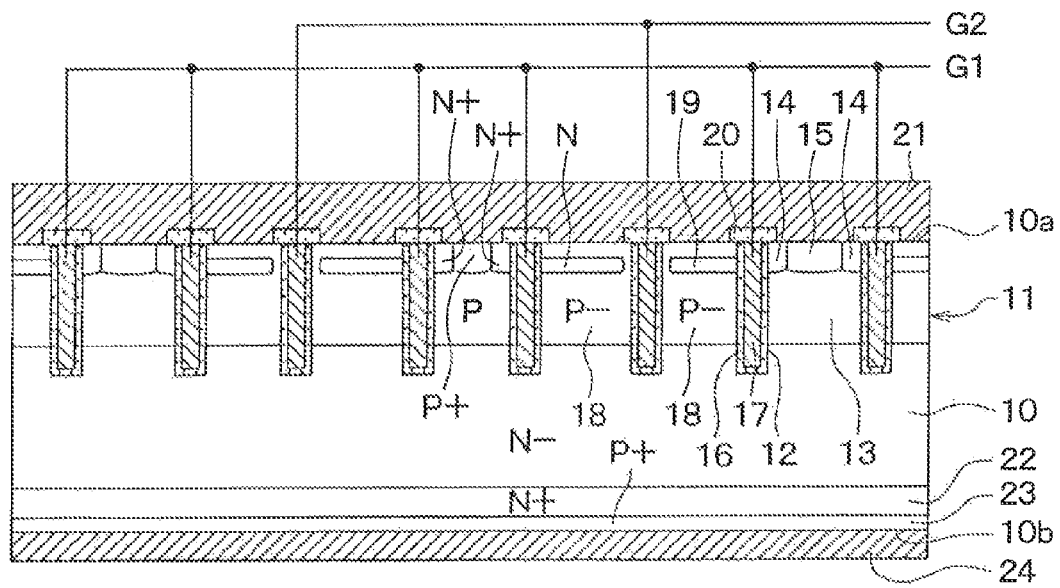
FIG. 13 is a cross-sectional view of an insulated gate semiconductor device according to a fourth embodiment of the present invention.

A difference of the present embodiment from the first to third embodiments is as follows. FIG. 13 is a cross-sectional view of an insulated gate semiconductor device according to the present embodiment. As shown in this figure, the gate electrodes 17 of the IGBT and the depletion-type MOSFET are isolated from each other. That is, the gate electrode 17 of the IGBT is connected to a G1 in FIG. 13, and the gate electrode 17 of the depletion-type MOSFET is connected to a G2 in FIG. 13.

In such an approach, the MOSFET is turned ON (so that the inversion layer can disappear) a few microseconds before the IGBT is turned OFF. Thus, the IGBT is turned OFF after some carriers are discharged. Therefore, a loss can be reduced. Likewise, the MOSFET is turned OFF (so that the inversion layer can appear) a few microseconds after the IGBT is turned ON. Therefore, a loss can be reduced. In this case, the threshold voltage Vt2 of the MOSFET can be equal to or lower than the threshold voltage Vt1 of the IGBT.

Fifth Embodiment

Figure 14:
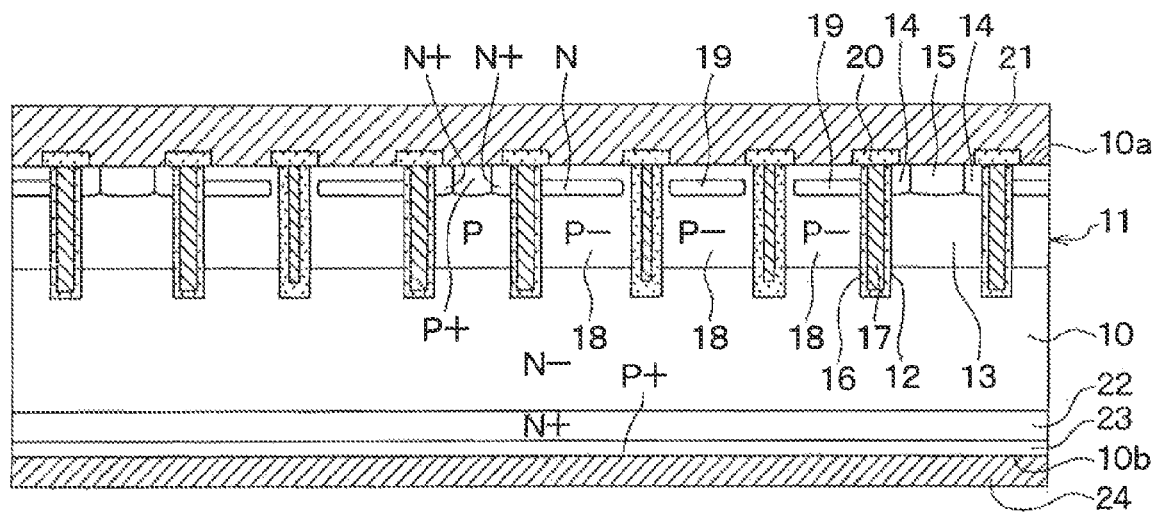
FIG. 14 is a cross-sectional view of an insulated gate semiconductor device according to a fifth embodiment of the present invention.

A difference of the present embodiment from the first to fourth embodiments is as follows. FIG. 14 is a cross-sectional view of an insulated gate semiconductor device according to the present embodiment. As shown in this figure, the ratio of the floating layer 18 to the channel layer 13 is further increased.

Specifically, the trenches 12 are formed in such a manner that another floating layer 18 is located between two floating layers 18. That is, three floating layers 18 are located between two channel layers 13. The hole stopper layer 19 formed in the other floating layer 18 between the two floating layers 18 is spaced from the gate insulation layer 16 formed on the side surface of the trench 12 that separates the other floating layer 18 from the adjacent floating layer 18. Since the area of the floating layer 18 is increased, the carrier discharging capability of the floating layer 18 can enhanced.

Sixth Embodiment

A difference of the present embodiment from the first to fifth embodiments is as follows. In the above embodiments, the IGBT element is formed. In the present embodiment, a diode element is also formed to form a reverse conducting insulated bipolar transistor (RC-IGBT).

Figure 15:
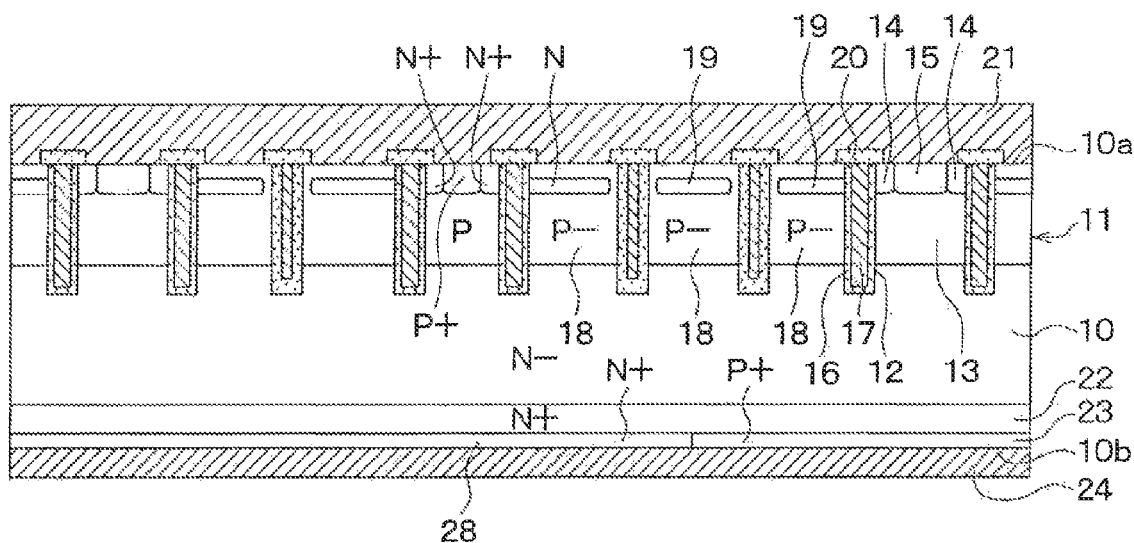
FIG. 15 is a cross-sectional view of an insulated gate semiconductor device according to a sixth embodiment of the present invention.

FIG. 15 is a cross-sectional view of an insulated gate semiconductor device according to the present embodiment. FIG. 15 is based on the structure of the insulated gate semiconductor device, shown in FIG. 14, according to the fifth embodiment. As shown in FIG. 15, an N$^+$-type cathode layer 28 is formed on the field stop layer 22. In such an approach, in a region where the cathode layer 28 is formed, a diode element is formed between the emitter and the collector. Thus, the insulated gate semiconductor device can be a RC-IGBT.

Seventh Embodiment

Figure 16:
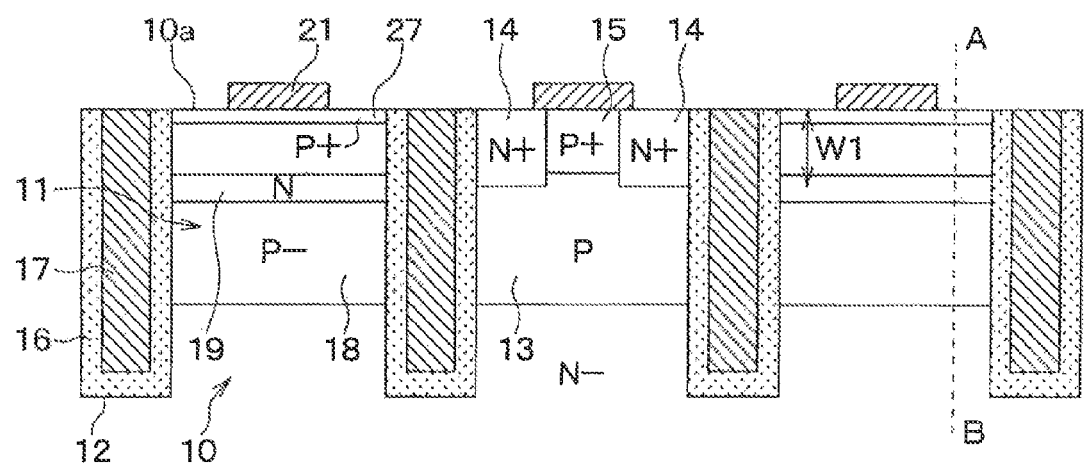
FIG. 16 is a partial cross-sectional view of an insulated gate semiconductor device according to a seventh embodiment of the present invention.

A difference of the present embodiment from the preceding embodiments is as follows. FIG. 16 is a partial cross-sectional view of an insulated gate semiconductor device according to the present embodiment. In particular, the cross-sectional view shows the first surface 10a side of the semiconductor substrate 10. In FIG. 16, the emitter electrode 21 except for a contact portion is omitted. Further, in FIG. 16, the contact layer 27 is formed on the surface portion of the floating layer 18.

Figure 17:
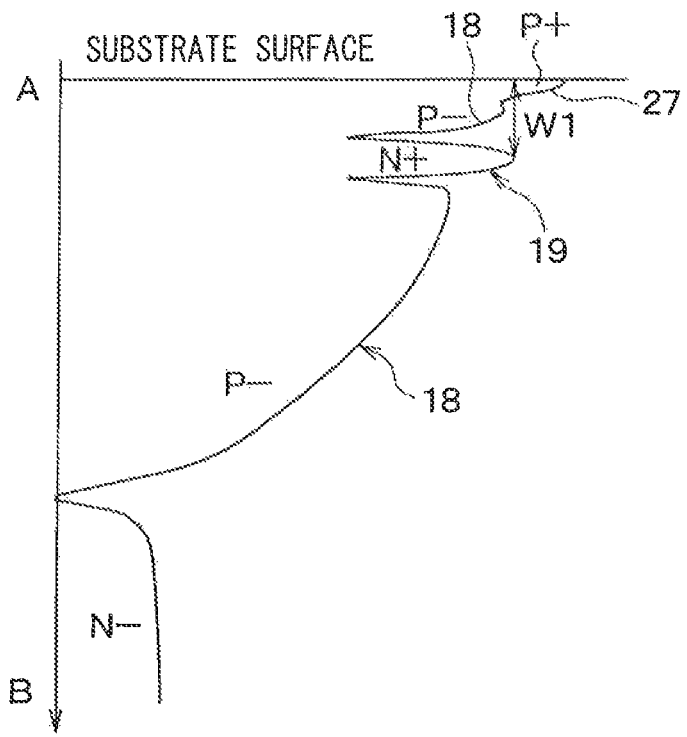
FIG. 17 is a diagram illustrating a profile taken along the line A-B in FIG. 16.
Figure 18:
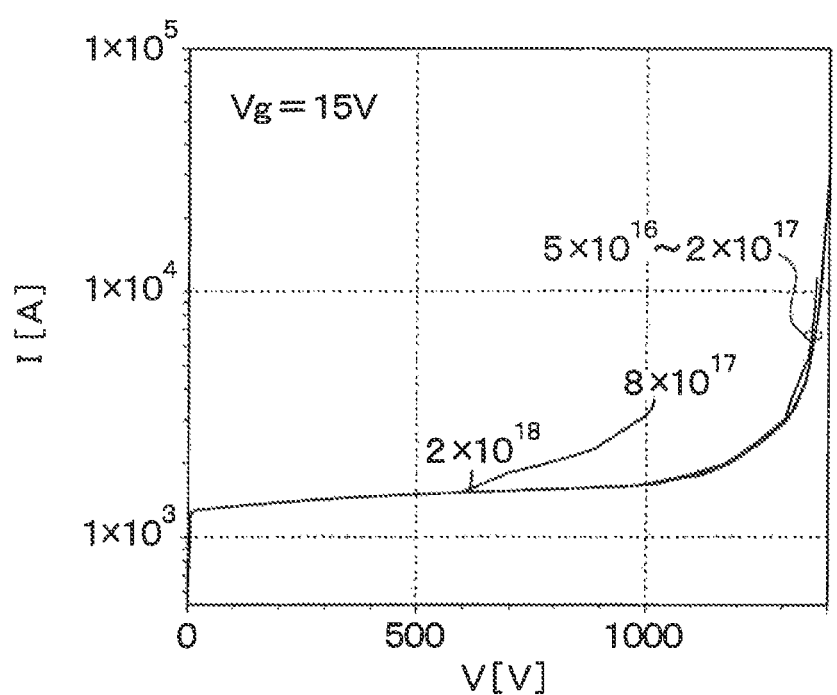
FIG. 18 is a diagram illustrating an I-V waveform observed in the profile of FIG. 17 when an impurity concentration of a hole stopper layer is adjusted at a gate voltage (Vg) of 15V.

FIG. 17 is a diagram illustrating a profile of FIG. 16 taken along the line A-B. FIG. 18 is a diagram illustrating an I-V waveform observed in the profile of FIG. 17 when the impurity concentration of the hole stopper layer 19 is adjusted with the gate voltage (Vg) fixed at 15V.

As shown in FIG. 18, the breakdown resistance to a large current decreases with an increase in the impurity concentration of the hole stopper layer 19. Although the increase in the impurity concentration of the hole stopper layer 19 can reduce the ON-voltage (Von), the increase in the impurity concentration of the hole stopper layer 19 can also reduce the breakdown resistance. Therefore, the impurity concentration of the hole stopper layer 19 cannot be increased.

Figure 19:
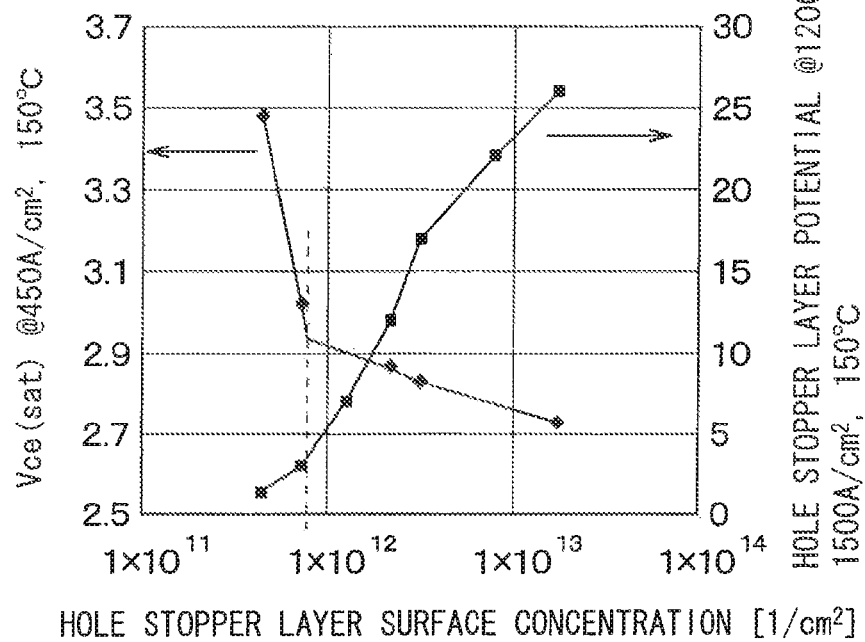
FIG. 19 is a diagram illustrating a potential of the hole stopper layer when a breakdown resistance is 1200V.

FIG. 19 is a graph showing a potential of the hole stopper layer 19 when the breakdown resistance is 1200V. In FIG. 19, "Vce" of the left axis represents a middle potential of a rising edge of a voltage waveform.

As shown in FIG. 19, the potential of the hole stopper layer 19 increases with an increase in the impurity concentration of the hole stopper layer 19. Therefore, a PN junction formed by a P-type region of the floating layer 18 on the emitter electrode 21 side with respect to the hole stopper layer 19 is reverse-biased and broken down. Therefore, there is a need to increase the breakdown resistance of the hole stopper layer 19 and the emitter electrode 21 side.

Figure 20:
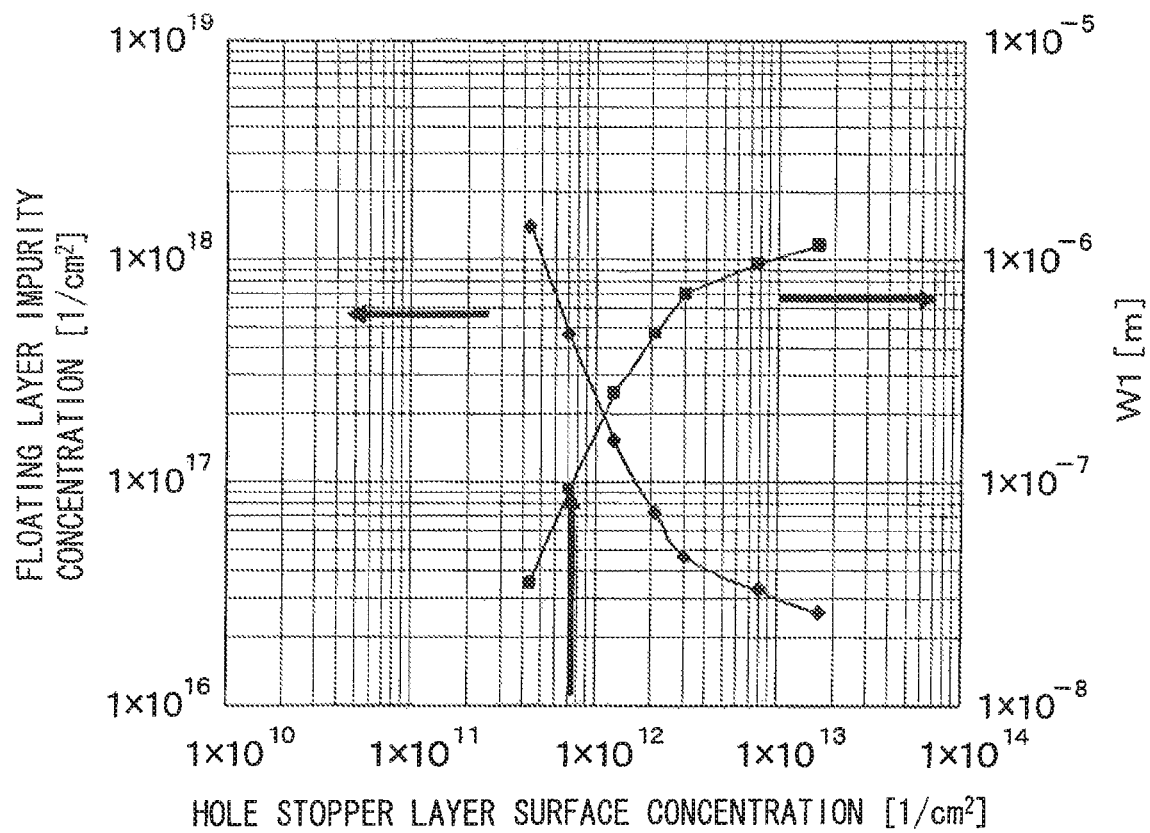
FIG. 20 is a diagram illustrating relationships of a hole stopper layer with respect to an impurity concentration of a floating layer and a depth W1 of the hole stopper layer.

However, as shown in FIG. 19, after a surface density NF of the hole stopper layer 19 reaches $7 \times 10^{11}/cm^2$, it is less likely that the ON-voltage (Von) decreases. Therefore, it is sufficient that the breakdown resistance is equal to or larger than a 3V potential increase of the hole stopper layer 19 when the surface density NF is $7 \times 10^{11}/cm^2$. To ensure the breakdown resistance of 3V or more, as shown in FIG. 20, the impurity concentration of a depleted portion of the floating layer 18 needs to be $4.5 \times 10^{17}/cm^3$ or less. Therefore, it is preferable that the impurity concentration of the floating layer 18 on the first surface 10a side of the semiconductor substrate 10 with respect to the hole stopper layer 19 be $4 \times 10^{17}/cm^3$ or less.

However, as shown in FIG. 20, if a distance W1 between the first surface 10a of the semiconductor substrate 10 and the hole stopper layer 19 is 0.1 μm or less, it is preferable that the contact layer 27 having a high impurity concentration be formed at a shallow depth near the surface of the semiconductor substrate 10.

Eighth Embodiment

Figure 21:
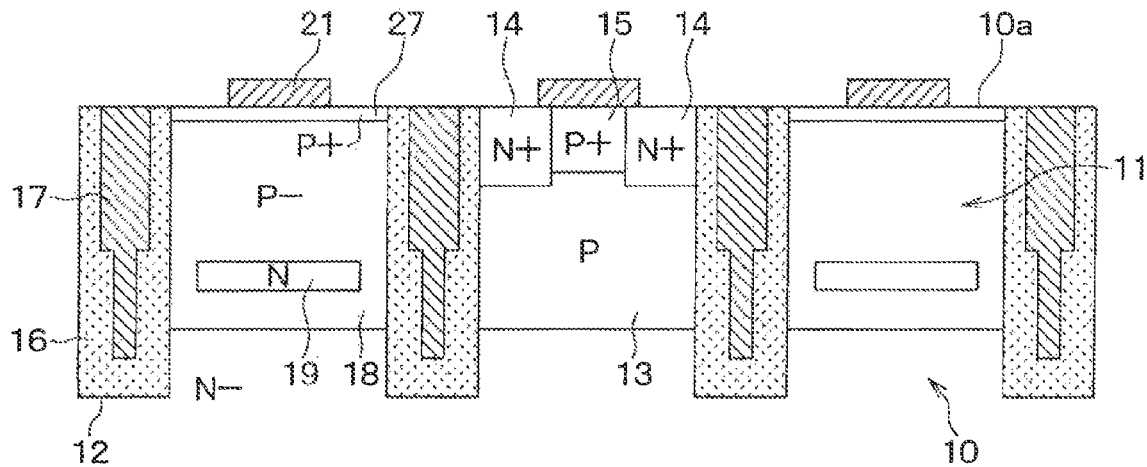
FIG. 21 is a partial cross-sectional view of an insulated gate semiconductor device according to an eighth embodiment of the present invention.

A difference of the present embodiment from the seventh embodiment is as follows. FIG. 21 is a partial cross-sectional view of an insulated gate semiconductor device according to the present embodiment. In particular, the cross-sectional view shows the first surface 10a side of the semiconductor substrate 10.

As shown in FIG. 21, the trenches 12 are formed in such a manner that the channel layer 13 and the floating layer 18 can be alternately arranged. Thus, one floating layer 18 is located between one channel layer 13 and the other channel layer 13.

The thickness of the gate insulation layer 16 varies in the thickness direction of the trench 12. Specifically, the gate insulation layer 16 has a first thickness on the bottom side of the trench 12 and a second thickness on the opening side of the trench 12. The second thickness is less than the first thickness. In other words, the gate insulation layer 16 is thicker on the bottom side of the trench 12 than on the opening side of the trench 12 in the depth direction of the trench 12.

The hole stopper layer 19 is located in the floating layer 18 on the bottom side of the trench 12, i.e., at a depth where the gate insulation layer 16 having the first thickness is located. Further, the hole stopper layer 19 is spaced from the gate insulation layer 16 having the first thickness. That is, the hole stopper layer 19 is spaced from both the gate insulation layer 16 formed on the side surface of the trench 12 that separates the floating layer 18 from one channel layer 13 and the gate insulation layer 16 formed on the side surface of the trench 12 that separates the floating layer 18 from the other channel layer 13.

Since the first thickness of the gate insulation layer 16, from which the hole stopper layer 19 is spaced, is larger than the second thickness of the gate insulation layer 16, the threshold voltage Vt2 of the MOSFET can be higher than the threshold voltage Vt1 of the IGBT.

Ninth Embodiment

Figure 22:
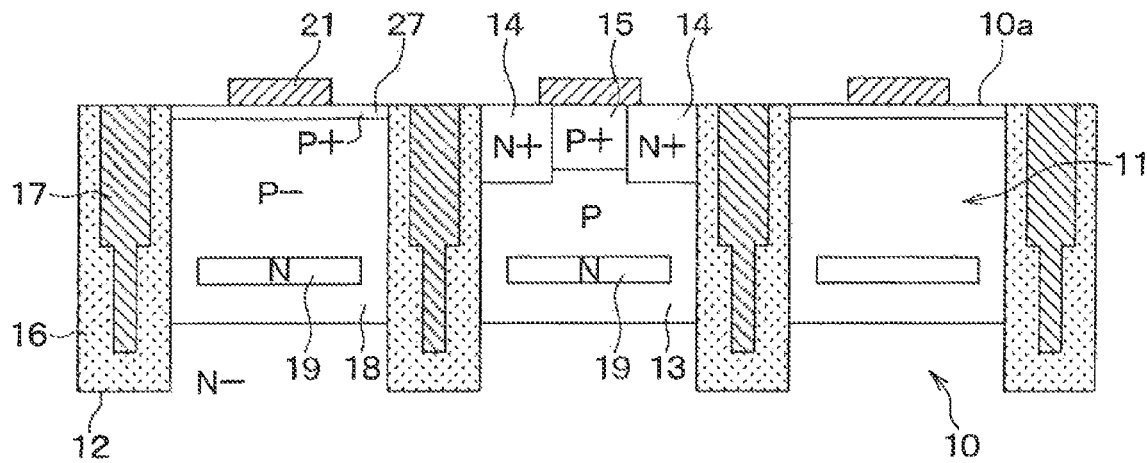
FIG. 22 is a partial cross-sectional view of an insulated gate semiconductor device according to a ninth embodiment of the present invention.

A difference of the present embodiment from the seventh embodiment is as follows. FIG. 22 is a partial cross-sectional view of an insulated gate semiconductor device according to the present embodiment. In particular, the cross-sectional view shows the first surface 10a side of the semiconductor substrate 10.

As shown in FIG. 22, the N-type hole stopper layer 19, which is spaced from both the first surface 10a of the semiconductor substrate 10 and the gate insulation layer 16, is also formed in the channel layer 13. The hole stopper layer 19 formed in the channel layer 13 is located at the depth, where the gate insulation layer 16 having the first thickness is located, and spaced from the gate insulation layer 16 having the first thickness.

In such an approach, when the inversion layer appears in the channel layer 13 during the ON period of the IGBT element, the inversion layer and the hole stopper layer 19 prevent the holes from being discharged. Thus, in the channel layer 13, the inversion layer and the hole stopper layer 19 serve as a potential wall for reducing the flow of holes in the channel layer 13. Therefore, the hole accumulation effect is enhanced so that an ON-voltage of the IGBT can be reduced.

Figure 23:
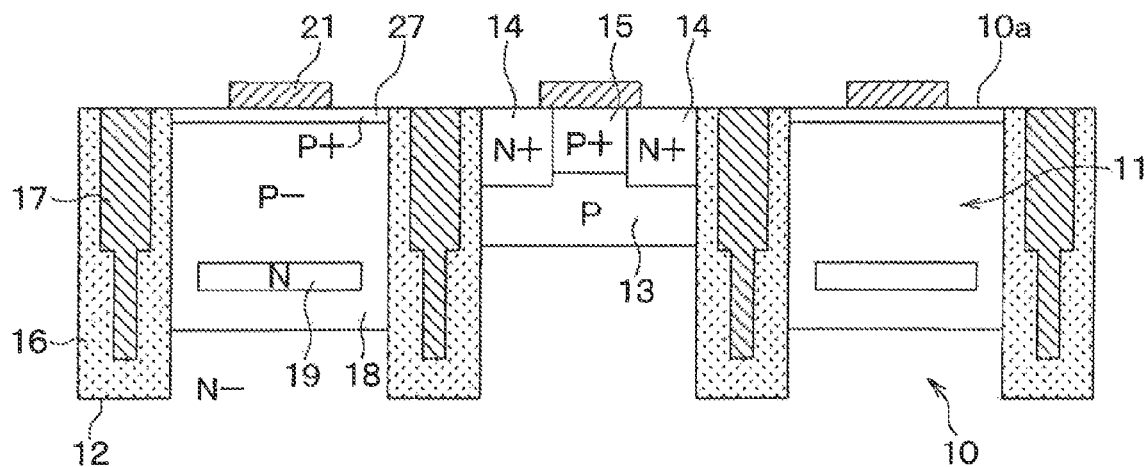
FIG. 23 is a partial cross-sectional view of an insulated gate semiconductor device according to a tenth embodiment of the present invention.

A difference of the present embodiment from the seventh embodiment is as follows. FIG. 23 is a partial cross-sectional view of an insulated gate semiconductor device according to the present embodiment. In particular, the cross-sectional view shows the first surface 10a side of the semiconductor substrate 10.

As shown in FIG. 23, with reference to the first surface 10a of the semiconductor substrate 10, the depth of the channel layer 13 is less than the depth of the floating layer 18 and equal to the depth of the gate insulation layer 16 having the second thickness.

In such an approach, the channel layer 13 is not affected by the gate insulation layer 16 having the first thickness so that the threshold voltage of the IGBT can depend only on the gate insulation layer 16 having the second thickness.

Eleventh Embodiment

Figure 24:
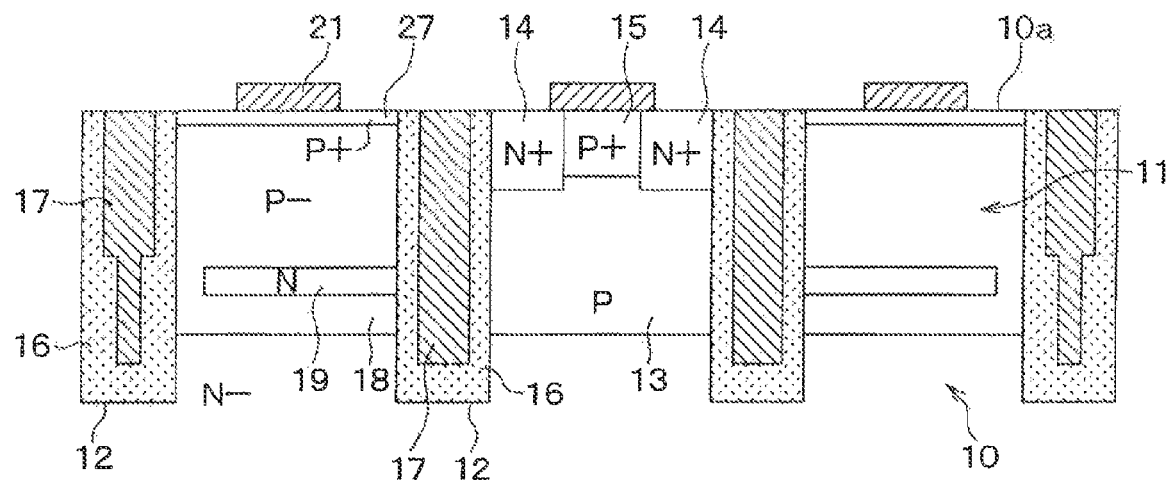
FIG. 24 is a partial cross-sectional view of an insulated gate semiconductor device according to an eleventh embodiment of the present invention.

A difference of the present embodiment from the seventh embodiment is as follows. FIG. 24 is a partial cross-sectional view of an insulated gate semiconductor device according to the present embodiment. In particular, the cross-sectional view shows the first surface 10a side of the semiconductor substrate 10.

As shown in FIG. 24, the trenches 12 are formed in such a manner that two floating layers 18 are located adjacent to each other between two channel layers 13. The hole stopper layer 19 is formed in each of the two floating layers 18 and in contact with the gate insulation layer 16 having the second thickness formed on the side surface of the trench 12 that separates the floating layer 18 from the channel layer 13. Further, the hole stopper layer 19, which is formed in each of the two floating layers 18, is spaced from the gate insulation layer 16 having the first thickness formed on the side surface of the trench 12 that separates one floating layer 18 from the other floating layer 18.

Since the gate insulation layer 16 that is not in contact with the channel layer 13 is formed to have the first thickness and the second thickness, the threshold voltage of the MOSFET can be increased. In contrast, since the gate insulation layer 16 that is in contact with the hole stopper layer 19 is thin, the threshold voltage of the IGBT element can be smaller than the threshold voltage of the MOSFET.

Twelfth Embodiment

Figure 25:
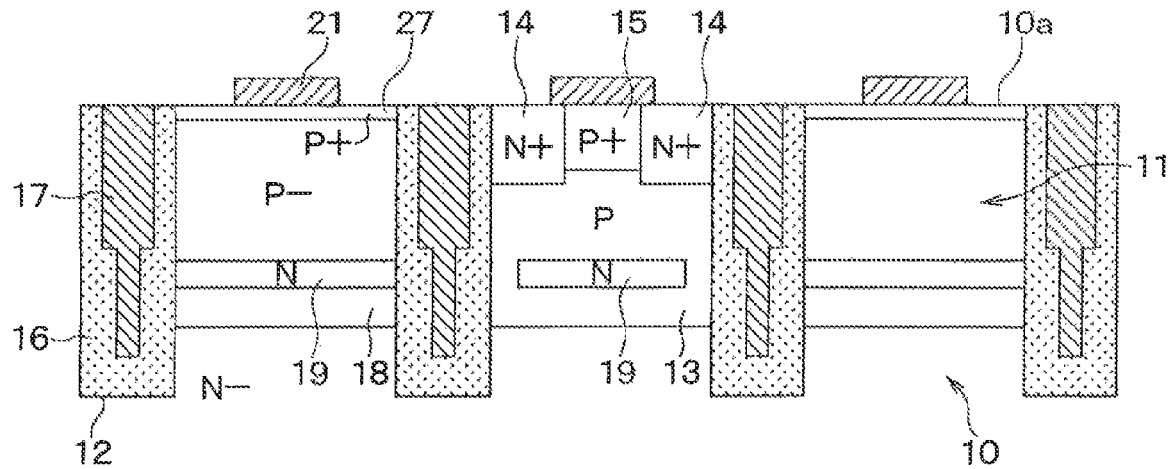
FIG. 25 is a partial cross-sectional view of an insulated gate semiconductor device according to a twelfth embodiment of the present invention.
Figure 26A:
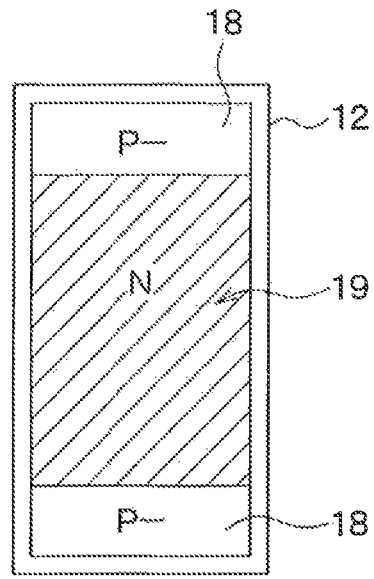
FIGS. 26A-26D are diagrams illustrating examples of a planar layout of the hole stopper layer.
Figure 26B:
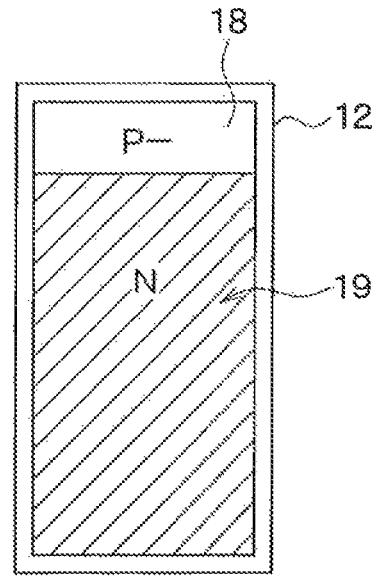
Figure 26C:
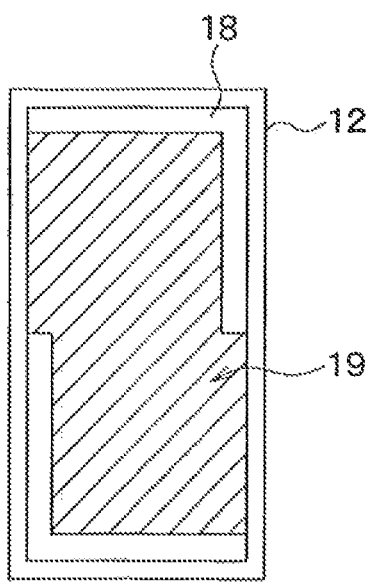
Figure 26D:
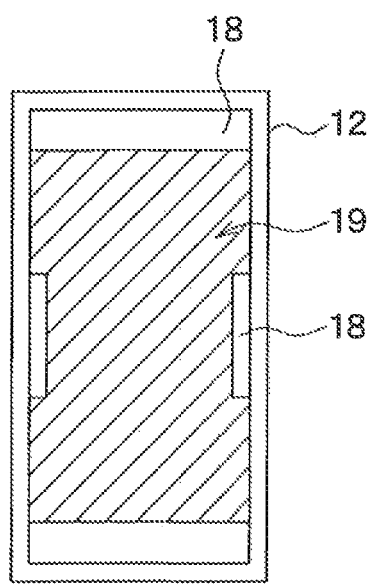

A difference of the present embodiment from the seventh embodiment is as follows. FIG. 25 is a partial cross-sectional view of an insulated gate semiconductor device according to the present embodiment. In particular, the cross-sectional view shows the first surface 10a side of the semiconductor substrate 10.

As shown in FIG. 25, the gate insulation layer 16 in each trench 12 is formed to have the first thickness and the second thickness. Further, like the structure shown in FIG. 22, the hole stopper layer 19 formed in the channel layer 13 is located at the depth, where the gate insulation layer 16 having the first thickness is located, and spaced from the gate insulation layer 16 having the first thickness.

In contrast, the hole stopper layer 19 formed in the floating layer 18 is in contact with the gate insulation layer 16 having the first thickness. In FIG. 25, it appears that the hole stopper layer 19 is entirely in contact with the gate insulation layer 16. Actually, as shown in FIGS. 26A, 26B, 26C, and 26D, the hole stopper layer 19 is partially spaced from the gate insulation layer 16 in an extension direction of the trench 12. It is noted that FIGS. 26A-26D are plane views at a depth where the hole stopper layer 19 is located. In FIGS. 26A-26D, the area of the hole stopper layer 19 is hatched.

As described above, the hole stopper layer 19 can be in contact with the gate insulation layer 16 that separates the floating layer 18 from the channel layer 13, as long as the hole stopper layer 19 is partially spaced from the gate insulation layer 16.

The layout of the hole stopper layer 19 shown in FIGS. 26A-26D can be applied to not only the present embodiment but also the other embodiments.

Thirteenth Embodiment

Figure 27:
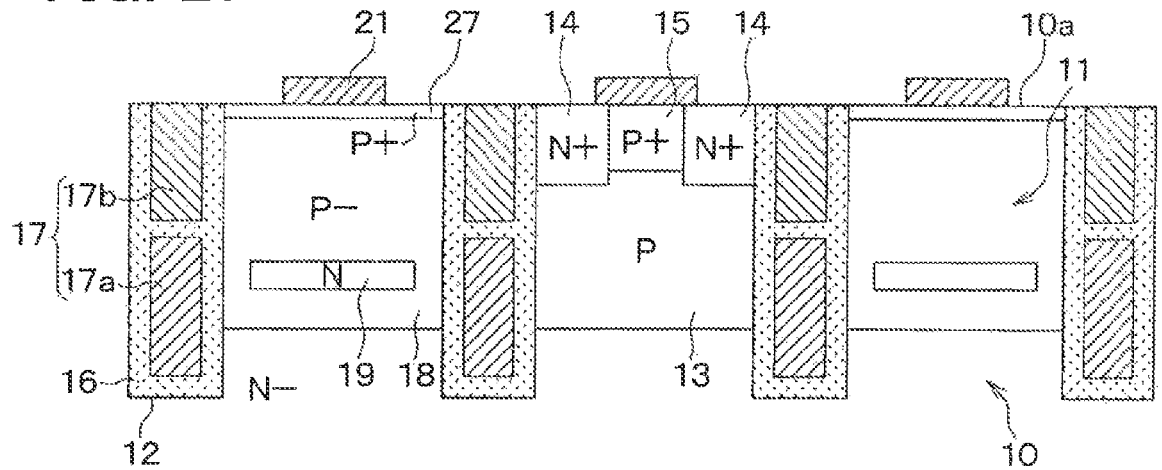
FIG. 27 is a partial cross-sectional view of an insulated gate semiconductor device according to a thirteenth embodiment of the present invention.

A difference of the present embodiment from the preceding embodiments is as follows. FIG. 27 is a partial cross-sectional view of an insulated gate semiconductor device according to the present embodiment. In particular, the cross-sectional view shows the first surface 10a side of the semiconductor substrate 10.

As shown in FIG. 27, the trenches 12 are formed in such a manner that the channel layer 13 and the floating layer 18 are alternately arranged. Thus, one floating layer 18 is located between one channel layer 13 and the other channel layer 13. The ratio of the floating layer 18 to the channel layer 13 can vary.

The gate electrode 17 formed in the trench 12 that separates the floating layer 18 from the channel layer 13 has a double gate structure including a first gate electrode 17a and a second gate electrode 17b. The first gate electrode 17a is located on the bottom side of the trench 12 and made of a semiconductor material such as P-type polysilicon. The second gate electrode 17b is located on the opening side of the trench 12 and formed on the first gate electrode 17a through a portion of the gate insulation layer 16.

The hole stopper layer 19 is spaced from both the gate insulation layer 16 formed on the side surface of the trench 12 that separates the floating layer 18 from one channel layer 13 and the gate insulation layer 16 formed on the side surface of the trench 12 that separates the floating layer 18 from the other channel layer 13. Further, the hole stopper layer 19 is spaced from the gate insulation layer 16 at a depth where the first gate electrode 17a is located in the depth direction of the trench 12.

Since the gate electrode 17 is divided into the first gate electrode 17a and the second gate electrode 17b, the threshold voltage of the MOSFET can be increased without controlling the thickness of the gate insulation layer 16. For example, the first gate electrode 17a and the second gate electrode 17b can be at the same potential. Alternatively, the second gate electrode 17b can be turned OFF before the first gate electrode 17a is turned OFF.

Fourteenth Embodiment

Figure 28:
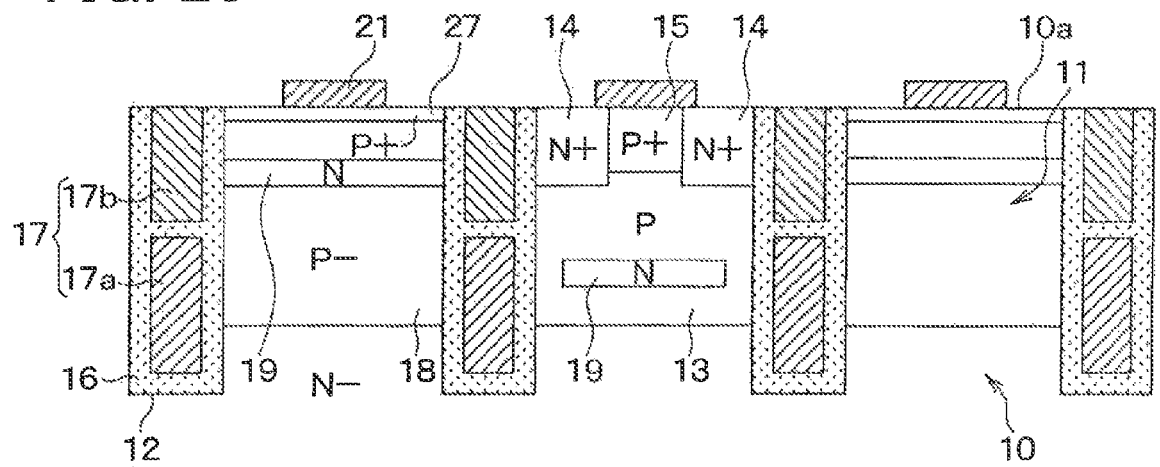
FIG. 28 is a partial cross-sectional view of an insulated gate semiconductor device according to a fourteenth embodiment of the present invention.

A difference of the present embodiment from the thirteenth embodiment is as follows. FIG. 28 is a partial cross-sectional view of an insulated gate semiconductor device according to the present embodiment. In particular, the cross-sectional view shows the first surface 10a side of the semiconductor substrate 10. As shown in this figure, each gate electrode 17 has the double gate structure including the first gate electrode 17a and the second gate electrode 17b.

The hole stopper layer 19 in the floating layer 18 is located at a depth where the second gate electrode 17b is located. Further, the hole stopper layer 19 is in contact with both the gate insulation layer 16 formed on the side surface of the trench 12 that separates the floating layer 18 from one channel layer 13 and the gate insulation layer 16 formed on the side surface of the trench 12 that separates the floating layer 18 from the other channel layer 13.

Further, the hole stopper layer 19 is formed in the channel layer 13. The hole stopper layer 19 in the channel layer 13 is spaced from the first surface 10a of the semiconductor substrate 10 and located at a depth, where the first gate electrode 17a is located, with reference to the first surface 10a of the semiconductor substrate 10. Thus, the hole stopper layer 19 in the channel layer 13 and the inversion layer appearing during the ON period of the IGBT element serve as a potential wall for reducing the flow of holes in the channel layer 13. Therefore, the ON-voltage of the IGBT can be reduced.

Fifteenth Embodiment

Figure 29:
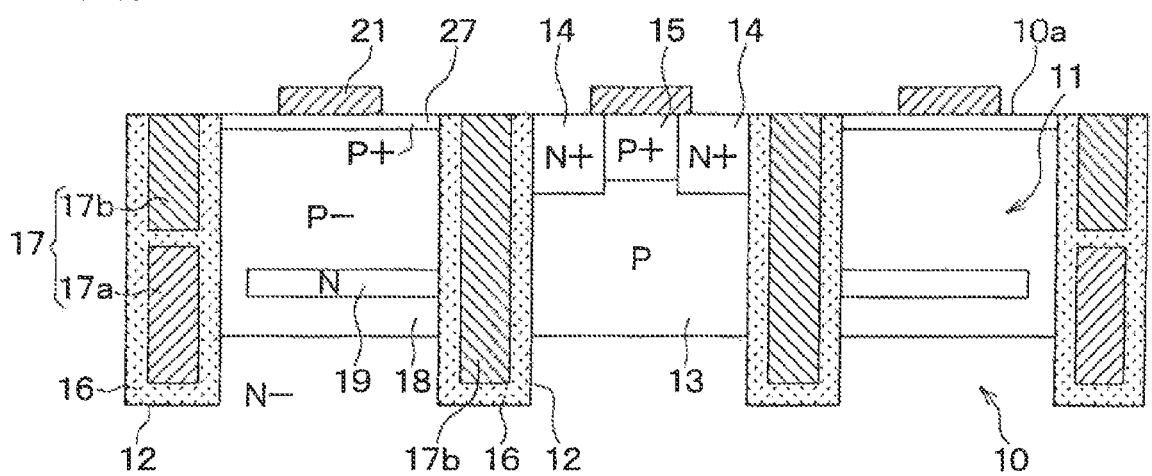
FIG. 29 is a partial cross-sectional view of an insulated gate semiconductor device according to a fifteenth embodiment of the present invention.

A difference of the present embodiment from the thirteenth embodiment is as follows. FIG. 29 is a partial cross-sectional view of an insulated gate semiconductor device according to the present embodiment. In particular, the cross-sectional view shows the first surface 10a side of the semiconductor substrate 10.

According to the present embodiment, the trenches 12 are formed in such a manner that two floating layers 18 are located adjacent to each other between two channel layers 13. The hole stopper layer 19 is formed in each of the two floating layers 18. Each hole stopper layer 19 is in contact with the gate insulation layer 16 formed on the side surface of the trench 12 that separates the floating layer 18 from the channel layer 13 and has only the second gate electrode 17b inside. However, each hole stopper layer 19 is spaced from the gate insulation layer 16 formed on the side surface of the trench 12 that separates one floating layer 18 from the other floating layer 18 and has both the first gate electrode 17a and the second gate electrode 17b inside.

In the above structure where the number of the floating layers 18 is increased, even when the gate insulation layer 16 that is in contact with the channel layer 13 is thin, the threshold voltage of the MOSFET can be increased by causing the gate electrode 17 in the trench 12 that separates the floating layers 18 from each other to have the double gate structure.

Sixteenth Embodiment

Figure 30:
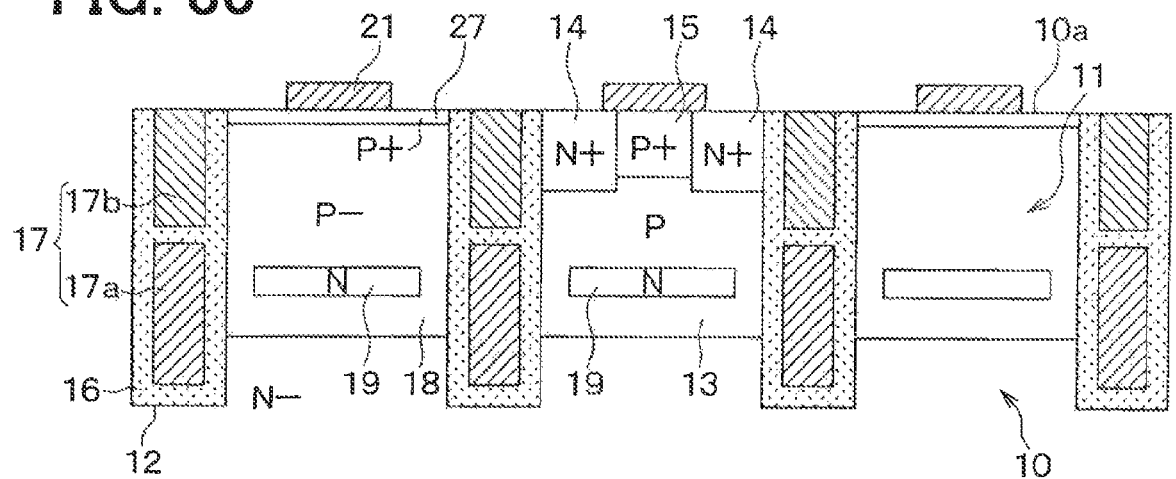
FIG. 30 is a partial cross-sectional view of an insulated gate semiconductor device according to a sixteenth embodiment of the present invention.

A difference of the present embodiment from the thirteenth embodiment is as follows. FIG. 30 is a partial cross-sectional view of an insulated gate semiconductor device according to the present embodiment. In particular, the cross-sectional view shows the first surface 10a side of the semiconductor substrate 10. As shown in this drawing, the hole stopper layer 19 can be formed in the channel layer 13 at a depth where the first gate electrode 17a is located.

Seventeenth Embodiment

Figure 31:
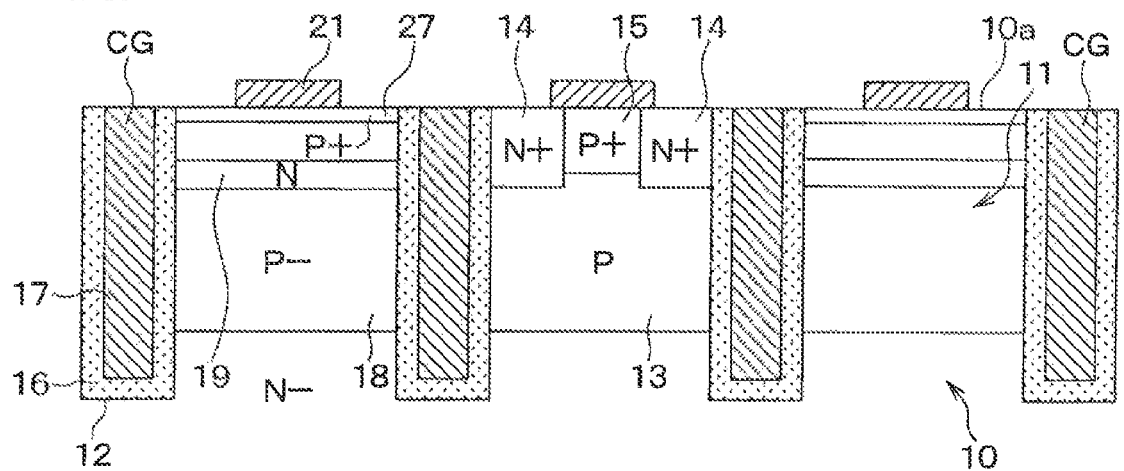
FIG. 31 is a partial cross-sectional view of an insulated gate semiconductor device according to a seventeenth embodiment of the present invention.

A difference of the present embodiment from the preceding embodiments is as follows. FIG. 31 is a partial cross-sectional view of an insulated gate semiconductor device according to the present embodiment. In particular, the cross-sectional view shows the first surface 10a side of the semiconductor substrate 10. As shown in this drawing, according to the present embodiment, the trenches 12 are formed in such a manner that two floating layers 18 are located adjacent to each other between two channel layers 13.

The hole stopper layer 19 is formed in each floating layer 18 and in contact with both the gate insulation layer 16 formed on the side surface of the trench 12 that separates the floating layer 18 from the channel layer 13 and the gate insulation layer 16 formed on the side surface of the trench 12 that separates the two floating layers 18 from each other.

Further, a negative bias is applied to the gate electrode 17 (CG) formed in the trench 12 that separates the two floating layers 18 from each other immediately before a SW operation. Thus, even when the hole stopper layer 19 is in contact with the gate insulation layer 16, the contact portion becomes a P-type inversion layer so that the flow of holes cannot be completely stopped by the hole stopper layer 19. Further, when the IGBT conducts, the gate electrode 17 is at the emitter potential so that the hole stopper layer 19 can be formed. It is noted that even when the gate electrode 17 is fixed at the emitter potential, the potential of the hole stopper layer 19 increases relative to the emitter potential during the SW operation. Therefore, the contact portion becomes the P-type inversion layer so that the same effect can be obtained.

Eighteenth Embodiment

In the above embodiments, the base layer 11 is divided into the channel layer 13 and the floating layer by the trench 12. In contrast, the present embodiment employs a full trench structure where the base layer 11 has only the channel layer 13 without the floating layer. The hole stopper layer 19 is formed in the channel layer 13.

Figure 32:
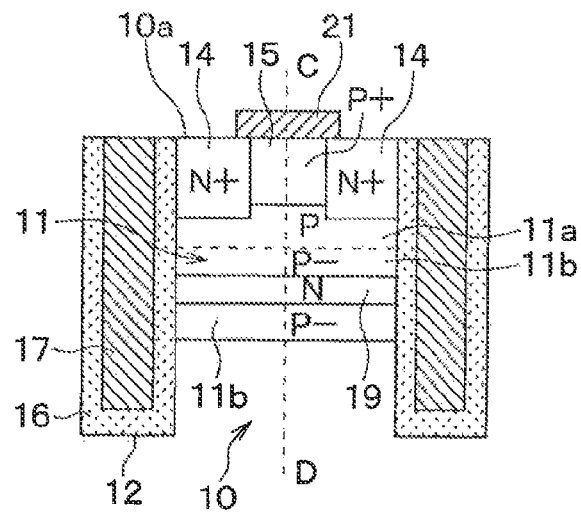
FIG. 32 is a cross-sectional view of a structure, in which a hole stopper layer is formed in a channel layer, according to an eighteenth embodiment of the present invention.
Figure 33:
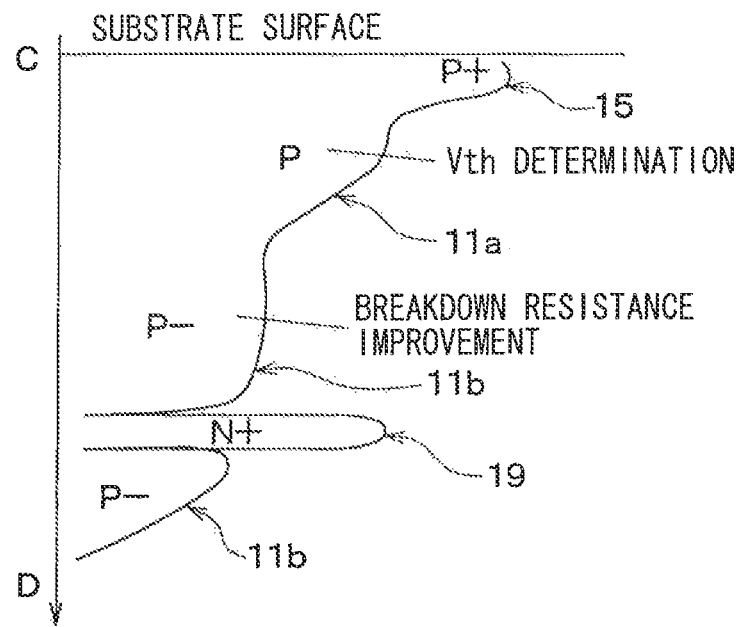
FIG. 33 is a diagram illustrating a profile taken along the line C-D in FIG. 32.

FIG. 32 is a partial cross-sectional view of a semiconductor device according to the present embodiment. In particular, the cross-sectional view shows the first surface 10a side of the semiconductor substrate 10. FIG. 33 is a diagram illustrating a profile of FIG. 32 taken along the line C-D.

As shown in FIG. 33, the base layer 11 is located on the first surface 10a side of the semiconductor substrate 10 and includes a P-type upper layer 11a and a P-type lower layer 11b. The emitter region 14 and the body region 15 are formed on the upper layer 11a. The lower layer 11b is formed under the upper layer 11a, and an impurity concentration of the lower layer 11b is lower than an impurity concentration of the upper layer 11a. Further, an N$^+$-type hole stopper layer 19 is formed in the lower layer 11b at a predetermined depth from an interface between the upper layer 11a and the lower layer 11b and in contact with the gate insulation layer 16.

A threshold voltage Vt depends on the P-type upper layer 11a. A portion of the lower layer 11b sandwiched between the upper layer 11a and the hole stopper layer 19 contributes to an improvement of the breakdown resistance.

Figure 34:
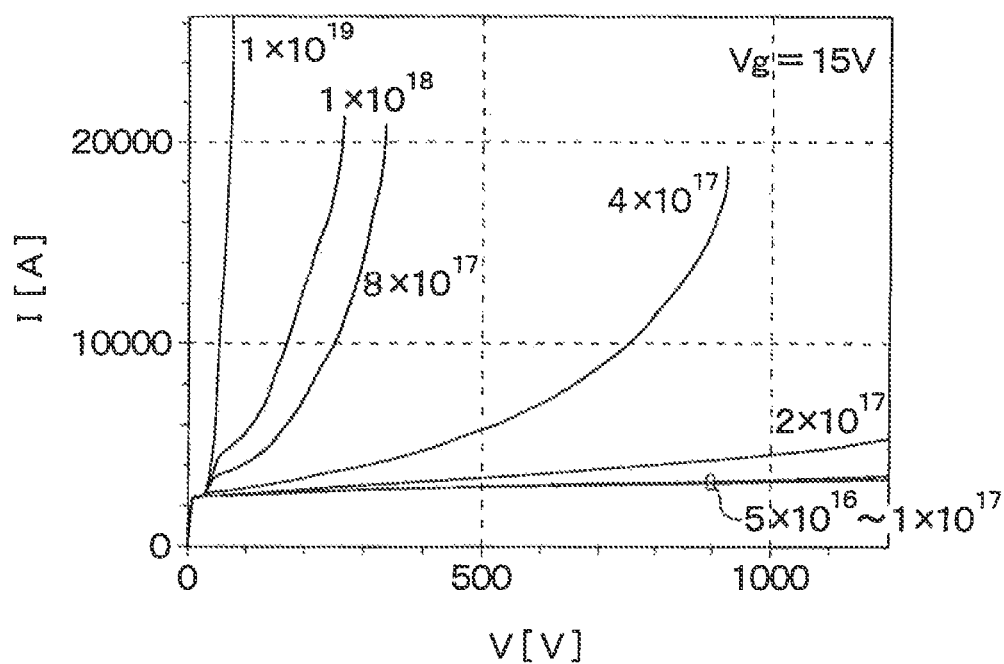
FIG. 34 is a diagram illustrating an I-V waveform observed in the profile of FIG. 33 when an impurity concentration of a hole stopper layer is adjusted at a gate voltage (Vg) of 15V.

FIG. 34 is a diagram illustrating an I-V waveform observed in the profile of FIG. 33 when an impurity concentration of the hole stopper layer 19 is adjusted with the gate voltage (Vg) fixed at 15V. As shown in this figure, the breakdown resistance to a large current decreases with an increase in the impurity concentration of the hole stopper layer 19. Although the increase in the impurity concentration of the hole stopper layer 19 can reduce the ON-voltage (Von), the increase in the impurity concentration of the hole stopper layer 19 can also reduce the breakdown resistance. Therefore, the impurity concentration of the hole stopper layer 19 cannot be increased.

Figure 35:
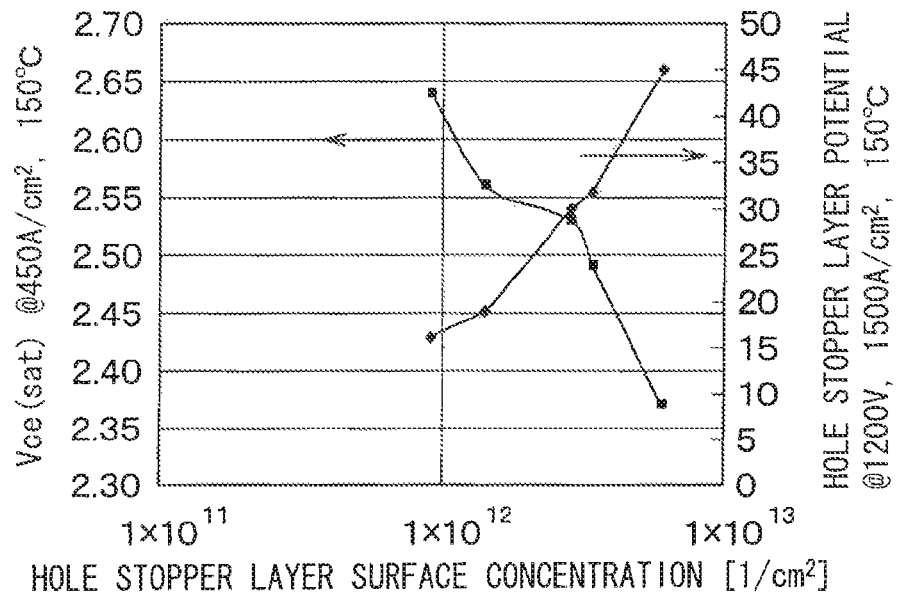
FIG. 35 is a diagram illustrating a potential of the hole stopper layer of the structure of FIG. 32 when a breakdown resistance is 1200V.

FIG. 35 is a graph showing a potential of the hole stopper layer 19 when the breakdown resistance is 1200V. As shown in this figure, the potential of the hole stopper layer 19 increases with an increase in the impurity concentration of the hole stopper layer 19. Therefore, the PN junction formed by the P-type region of the floating layer 18 on the emitter electrode 21 side with respect to the hole stopper layer 19 is reverse-biased and broken down. Therefore, there is a need to increase the breakdown resistance of the hole stopper layer 19 and the emitter electrode 21 side.

Figure 36:
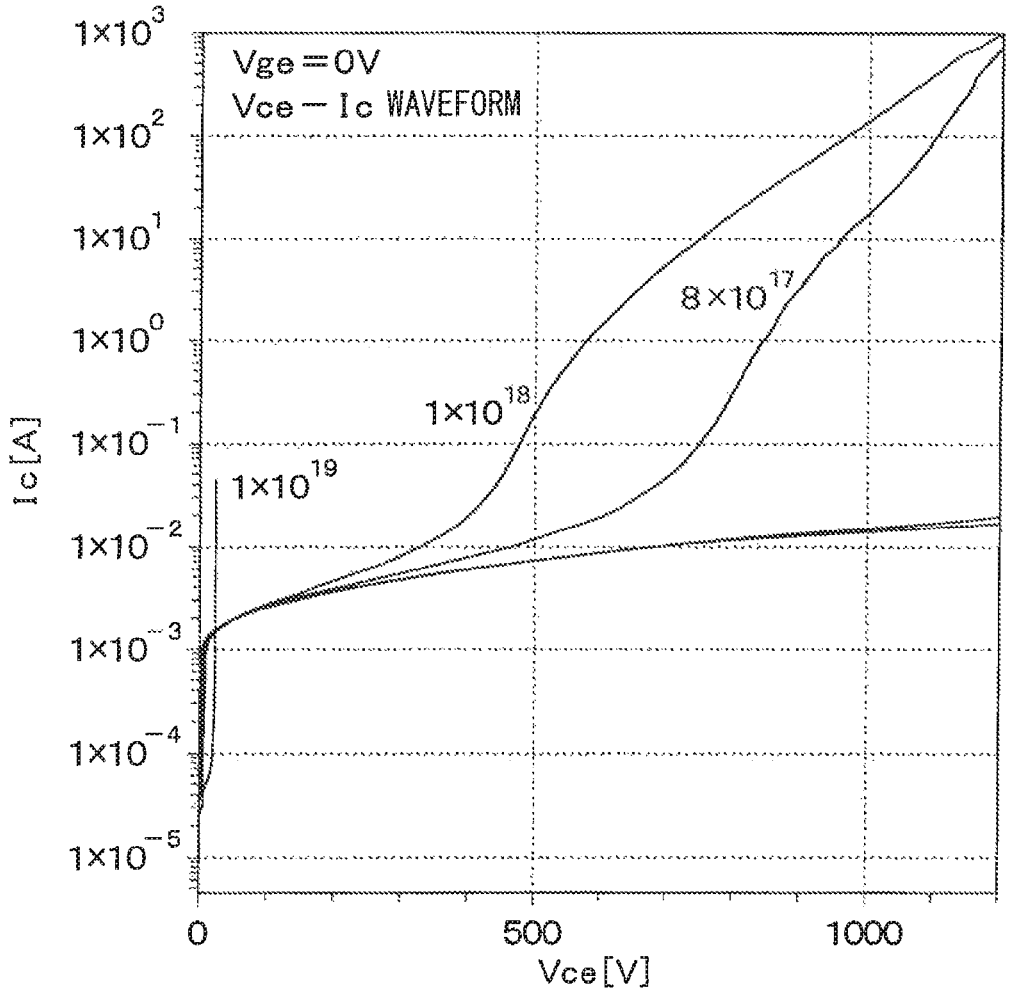
FIG. 36 is a diagram illustrating a waveform of the breakdown resistance observed when the impurity concentration of the hole stopper layer is adjusted.

However, as shown in FIG. 32, when the hole stopper layer 19 is formed in each base layer 11, a region of the based layer 11 below the hole stopper layer 19 becomes a floating region. Therefore, as compared to when the hole stopper layer 19 is formed in the dummy portion (floating layer 18), the potential of the hole stopper layer 19 increases sharply. Therefore, as shown in FIG. 33, it is important to reduce the impurity concentration of a junction portion of the hole stopper layer 19, but it is not enough. FIG. 36 is a diagram illustrating a waveform of the breakdown resistance observed when the impurity concentration of the hole stopper layer 19 is adjusted. As shown in this figure, when the impurity concentration of the hole stopper layer 19 is increased, the breakdown resistance is not increased. A reason for this is that when the impurity concentration of the hole stopper layer 19 is increased, a discharge path for holes is reduced so that the potential of the hole stopper layer 19 can be increased. As a result, a breakdown occurs. Therefore, when Vge=0, the potential of the region of the based layer 11 below the hole stopper layer 19 needs to be fixed at 0V.

Figure 37:
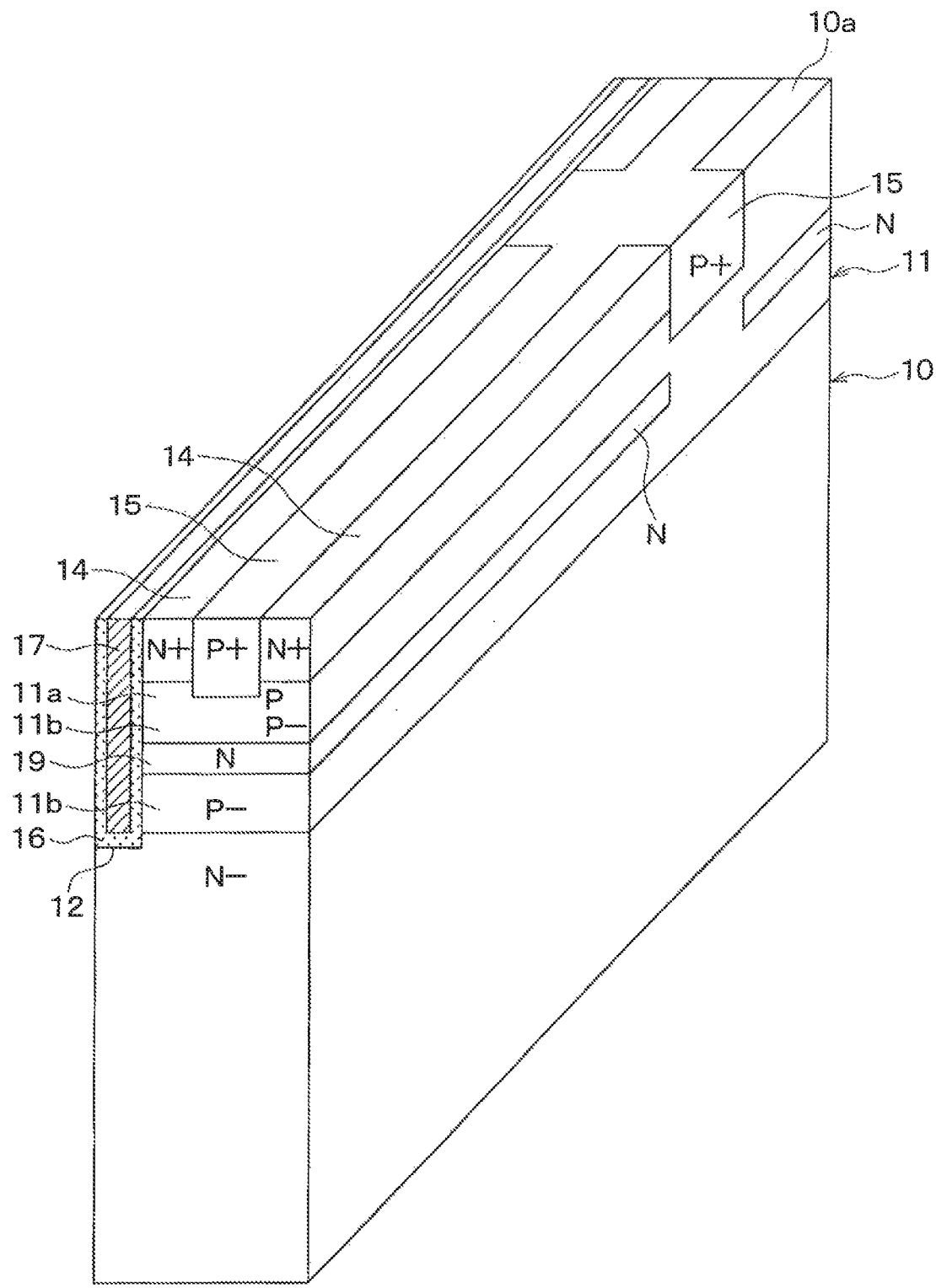
FIG. 37 is a partial cross-sectional view of an insulated gate semiconductor device according to an eighteenth embodiment of the present invention.

In view of the above, a structure shown in FIG. 37 is employed. Specifically, the P$^+$-type body region 15 having a higher impurity concentration than the base layer 11 is formed on the surface portion of the base layer 11. Further, the emitter region 14 and the body region 15 extend along the extension direction of the trench 12. In FIG. 37, a structure of the second surface 10b side of the semiconductor substrate 10 is omitted.

Further, a portion of the body region 15 is formed along the extension direction of the trench 12. The other portion of the body region 15 is formed along a direction perpendicular to the extension direction of the trench 12 and in contact with the gate insulation layer 16 of the adjacent trench 12 in the middle of the extension direction of the trench 12. Further, the other portion of the body region 15 is deeper than the emitter region 14.

The hole stopper layer 19 is formed along the extension direction of the trench 12, and an end of the hole stopper layer 19 is terminated below the body region 15. In such a approach, the lower layer 11b below the hole stopper layer 19 can be grounded during the switching operation.

Nineteenth Embodiment

Figure 38:
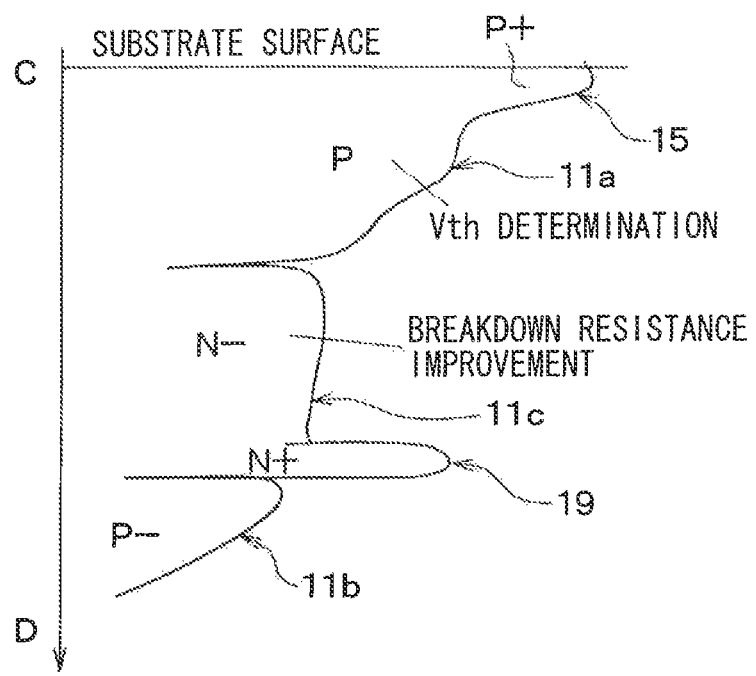
FIG. 38 is a diagram illustrating a profile of an insulated gate semiconductor device according to a nineteenth embodiment of the present invention.

A difference of the present embodiment from the eighteenth embodiment is as follows. FIG. 38 is a diagram illustrating a profile of an insulated gate semiconductor device according to the present embodiment and corresponding to the profile of FIG. 32 taken along the line C-D.

As shown in FIG. 38, the base layer 11 is located on the first surface 10a side of the semiconductor substrate 10 and includes a P-type upper layer 11a and an N$^-$-type middle layer 11c. The emitter region 14 and the body region 15 are formed on the upper layer 11a. The middle layer 11c is formed under the upper layer 11a. The base layer 11 further includes an N$^+$-type hole stopper layer 19. The hole stopper layer 19 is formed under the middle layer 11c and at least partially spaced form the gate insulation layer 16. An impurity concentration of the hole stopper layer 19 is higher than an impurity concentration of the middle layer 11c. The base layer 11 further includes a P$^-$-type lower layer 11b. The lower layer 11b is formed under the hole stopper layer 19, and an impurity concentration of the lower layer 11b is lower than an impurity concentration of the upper layer 11a.

In the structure shown in the eighteenth embodiment, the P$^-$-type lower layer 11b is partially sandwiched between the upper layer 11a and the hole stopper layer 19. In contrast, in the present embodiment, the N$^-$-type middle layer 11c is partially sandwiched between the upper layer 11a and the hole stopper layer 19. Like the lower layer 11b of the eighteenth embodiment, the middle layer 11c of the present embodiment can contribute to the improvement of the breakdown resistance.

Twentieth Embodiment

Figure 39:
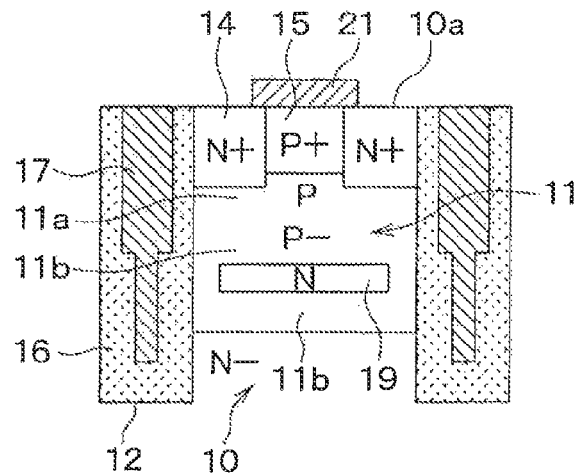
FIG. 39 is a partial cross-sectional view of an insulated gate semiconductor device according to a twentieth embodiment of the present invention.

A difference of the present embodiment from the eighteenth and nineteenth embodiments is as follows. FIG. 39 is a partial cross-sectional view of a semiconductor device according to the present embodiment. In particular, the cross-sectional view shows the first surface 10a side of the semiconductor substrate 10. The base layer 11 is structured in the same manner as shown in the eighteenth embodiment. Alternatively, the base layer 11 can be structured in the same manner as shown in the nineteenth embodiment.

As shown in FIG. 39, the gate insulation layer 16 has a first thickness on the bottom side of the trench 12 and a second thickness on the opening side of the trench 12. The first thickness is larger than the second thickness. The hole stopper layer 19 is located at a depth where the gate insulation layer 16 having the first thickness is located and spaced from the gate insulation layer 16.

In such a structure, an area between the emitter electrode 21 and the collector electrode 24, where a current flows in the base layer 11, acts as an IGBT. An area having a channel constructed with a portion of the base layer 11 between the gate insulation layer 16 and the hole stopper layer 19 between the emitter electrode 21 and the collector electrode 24 acts as a depletion-type MOSFET. Since the thickness of the gate insulation layer 16 varies in the depth direction of the trench 12, the threshold voltage Vt2 of the MOSFET can be higher than the threshold voltage Vt1 of the IGBT.

As described above, even in the full trench structure, the threshold voltage of the MOSFET can be increased by changing the thickness of the gate insulation layer 16.

Twenty-First Embodiment

Figure 40:
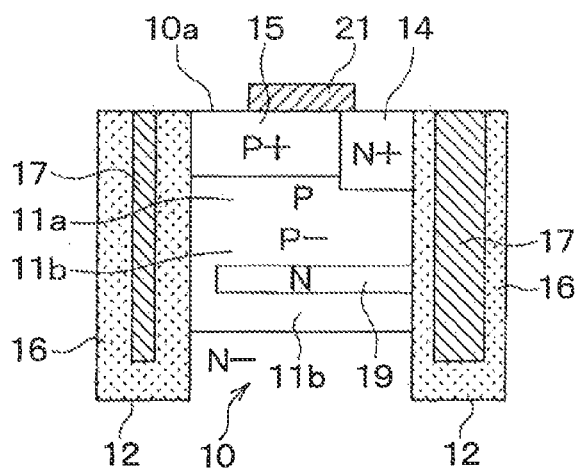
FIG. 40 is a partial cross-sectional view of an insulated gate semiconductor device according to a twenty-first embodiment of the present invention.

A difference of the present embodiment from the eighteenth and nineteenth embodiments is as follows. FIG. 40 is a partial cross-sectional view of a semiconductor device according to the present embodiment. In particular, the cross-sectional view shows the first surface 10a side of the semiconductor substrate 10. The base layer 11 is structured in the same manner as shown in the eighteenth embodiment or the nineteenth embodiment.

As shown in FIG. 40, the thickness of the gate insulation layer 16 formed in one trench 12 is larger than the thickness of the gate insulation layer 16 formed in the other trench 12 that is located adjacent to the one trench 12.

The emitter region 14 is formed in the base layer 11 and in contact with the thin gate insulation layer 16 formed in the other trench 12. That is, the emitter region 14 is formed only on the other trench 12 side and spaced from the thick gate insulation layer 16 formed in the one trench 12.

Further, the hole stopper layer 19 is formed in the base layer 11. The hole stopper layer 19 is in contact with the thin gate insulation layer 16 formed in the other trench 12 and spaced from the thick gate insulation layer 16 formed in the one trench 12. The emitter region 14 can be reduced in the above manner.

Twenty-Second Embodiment

Figure 41A:
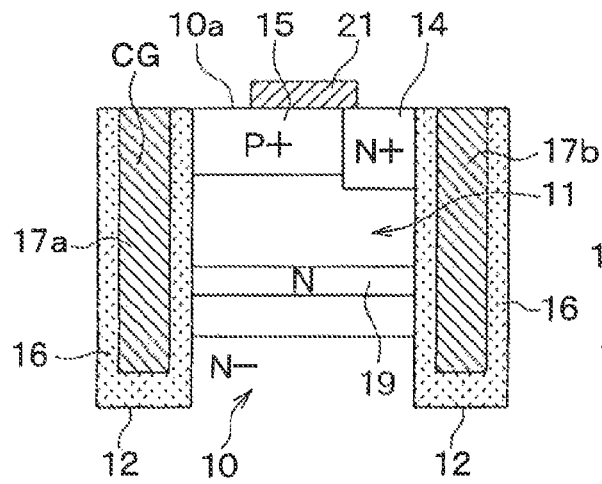
FIGS. 41A and 41B are partial cross-sectional views of an insulated gate semiconductor device according to a twenty-second embodiment of the present invention.

A difference of the present embodiment from the eighteenth and nineteenth embodiments is as follows. FIG. 41A is a partial cross-sectional view of a semiconductor device according to the present embodiment. In particular, the cross-sectional view shows the first surface 10a side of the semiconductor substrate 10. The base layer 11 is structured in the same manner as shown in the eighteenth embodiment or the nineteenth embodiment.

As shown in FIG. 41A, the emitter region 14 is formed in the base layer 11. The emitter region 14 is spaced from one trench 12 and in contact with the other trench 12 that is located adjacent to the one trench 12. Thus, the emitter region 14 is reduced. The hole stopper layer 19 is in contact with both the gate insulation layer 16 formed in the one trench 12 and the gate insulation layer 16 formed in the other trench 12.

Figure 41B:
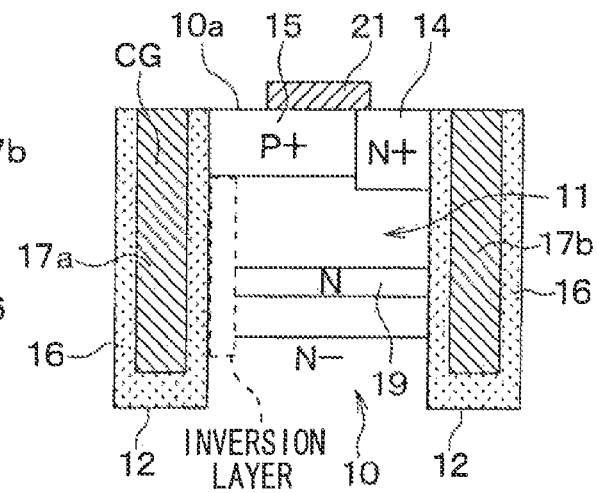

In this structure, a negative bias is applied to the gate electrode 17 formed in the trench 12 that is spaced from the emitter region 14 immediately before the SW operation. Thus, as shown in FIG. 41B, a portion of the base layer 11 along the wall surface of the one trench 12 becomes an inversion layer. Therefore, a portion of the base layer 11 below the hole stopper layer 19 is grounded during the SW operation. Further, when the IGBT conducts, the gate electrode 17 is returned to the emitter potential so that the hole stop effect can be maintained. It is noted that even when the gate electrode 17 is fixed at the emitter potential, the same effect can be obtained as mentioned in the seventeenth embodiment.

For example, a voltage of 15V can be applied to the gate electrode 17 formed in the other trench 12 that is in contact with the emitter region 14.

Twenty-Third Embodiment

A difference of the present embodiment from the eighteenth to twenty-second embodiments is as follows. In the present embodiment, a difference in work function between P-type polysilicon and N-type silicon. In a typical IGBT, an impurity concentration of N-type silicon in a drift layer is low. Therefore, even when a potential of P-type polysilicon is equal to an emitter potential, a P-type inversion layer can be formed in the N-type silicon. Holes can be efficiently discharged by partially connecting the inversion layer to the emitter electrode 21. Thus, an increase in a potential of the hole stopper layer 19 can be reduced. Therefore, the breakdown resistance of the IGBT can be increased, and a switching loss can be reduced.

Figure 42:
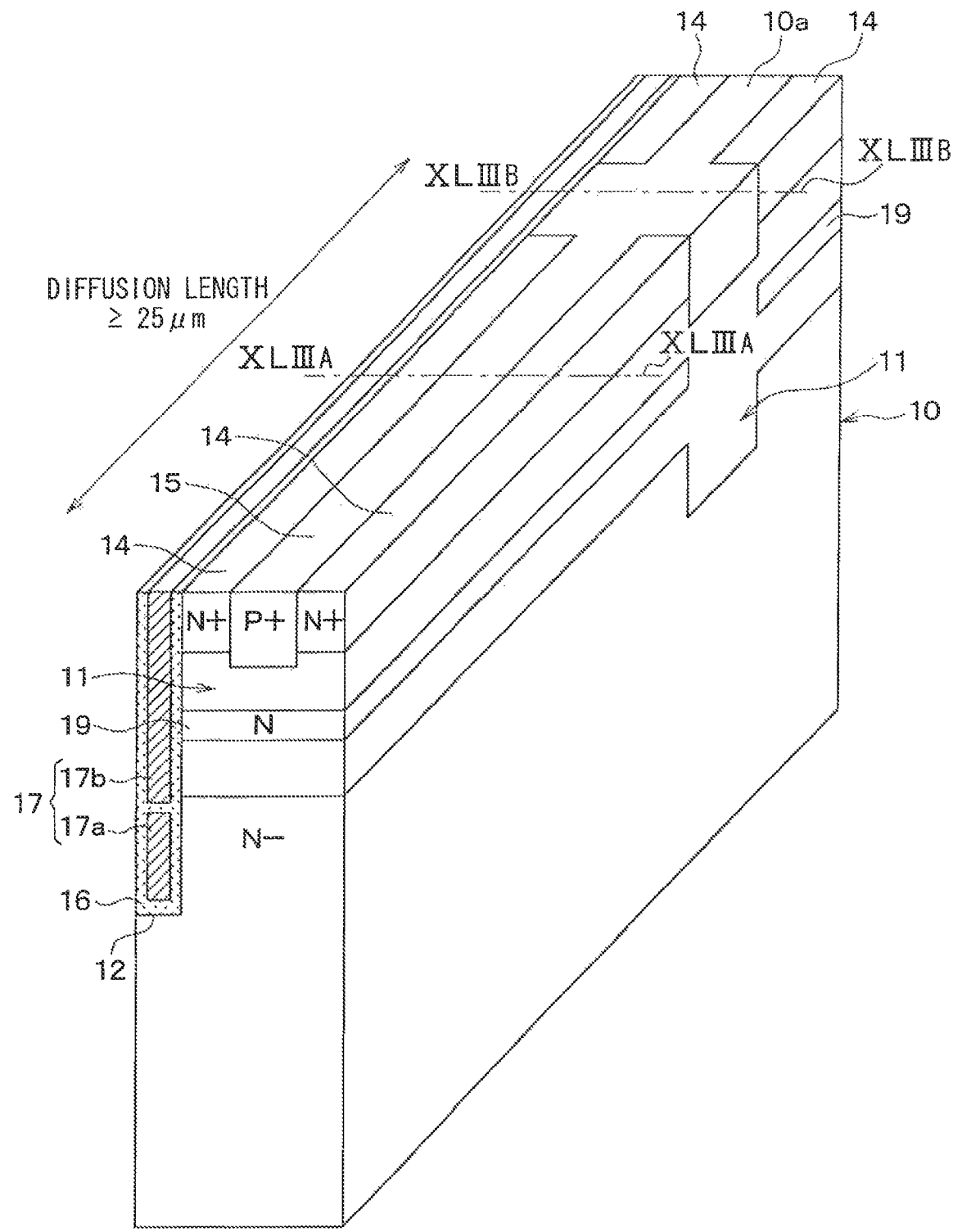
FIG. 42 is a partial cross-sectional view of an insulated gate semiconductor device according to a twenty-third embodiment of the present invention.

A concrete structure is shown in FIG. 42. As shown in this perspective view, like the fourteenth embodiment, the gate electrode 17 has the double gate structure including the first gate electrode 17a and the second gate electrode 17b. According to the present embodiment, each gate electrode 17 has the double gate structure. The base layer 11 is structured in the same manner as shown in the eighteenth embodiment or the nineteenth embodiment. The first gate electrode 17a is negatively biased or connected to the emitter so that the P-type inversion layer can be formed. It is preferable that the first gate electrode 17a be at the gate potential (at the same potential as the second gate electrode 17b) only when the IGBT conducts (except immediately before the SW operation).

Figure 43A:
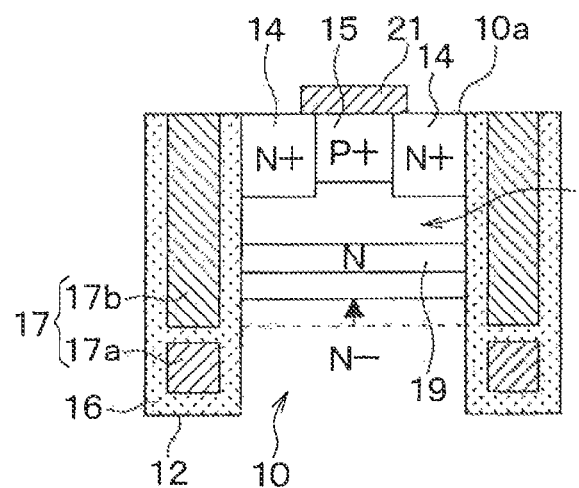
FIG. 43A is a diagram illustrating a cross-sectional view taken along the line XLIIIA-XLIIIA in FIG. 42.
Figure 43B:
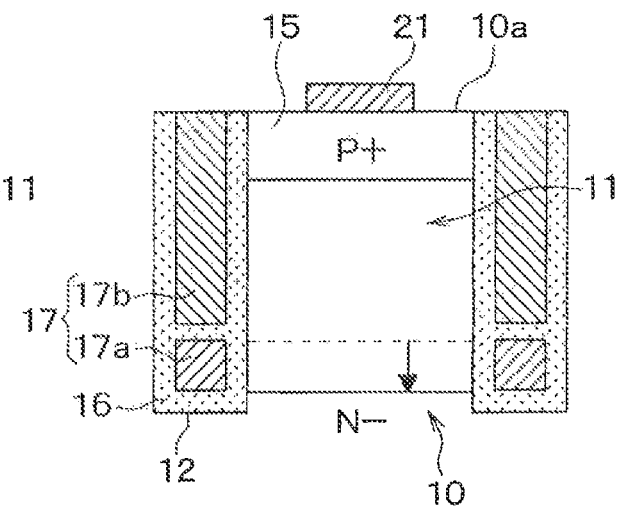
FIG. 43B is a diagram illustrating a cross-sectional view taken along the line XLIIIB-XLIIIB in FIG. 42.

FIG. 43A is a diagram illustrating a partial cross-sectional view taken along the line XLIIIA-XLIIIA in FIG. 42, and the cross-sectional view shows the first surface 10a side of the semiconductor substrate 10. As shown in this figure, with reference to the first surface 10a of the semiconductor substrate 10, a depth of the base layer 11 is less than a depth of the second gate electrode 17b. FIG. 43B is a diagram illustrating a partial cross-sectional view taken along the line XLIIIB-XLIIIB in FIG. 42, and the cross-sectional view shows the first surface 10a side of the semiconductor substrate 10. As shown in this figure, a portion of the base layer 11 located in the middle of the extension direction of the trench 12 is formed at a depth where the first gate electrode 17a is located. As shown in FIG. 42, the portion of the base layer 11 penetrates the hole stopper layer 19 and reaches the drift layer. It is preferable that an interval at which the base layer 11 penetrates the hole stopper layer 19 in the extension direction of the trench 12 be equal to or larger than 25 μm, which is a diffusion length of Si.

As described above, the first gate electrode 17a is at the same potential as the second gate electrode 17b, negative-biased, or connected to the emitter. In this case, the first gate electrode 17a can be continuously negative-biased or connected to the emitter. Alternatively, the first gate electrode 17a can be negative-biased or connected to the emitter each time the P-type inversion layer is formed.

Twenty-Fourth Embodiment

Figure 44:
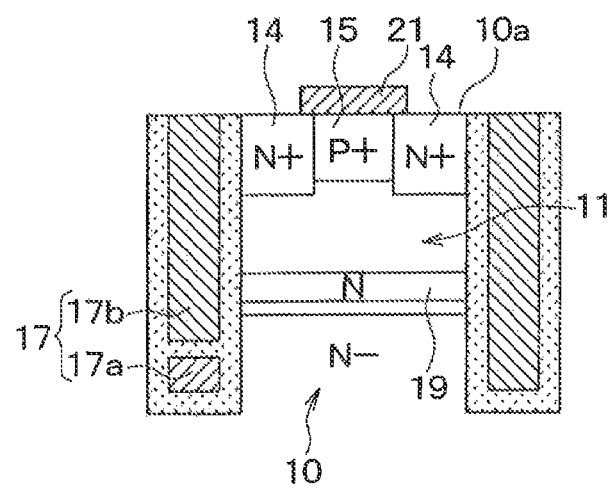
FIG. 44 is a partial cross-sectional view of an insulated gate semiconductor device according to a twenty-fourth embodiment of the present invention.

A difference of the present embodiment from the twenty-third embodiment is as follows. FIG. 44 is a diagram illustrating a partial cross-sectional view of an insulated gate semiconductor device according to the present embodiment, and the cross-sectional view shows the first surface 10*a* side of the semiconductor substrate 10. As shown in this figure, it is not essential that each gate electrode 17 has the double gate structure. The base layer 11 is structured in the same manner as shown in the eighteenth embodiment or the nineteenth embodiment.

MODIFICATIONS

The embodiments described above can be modified on various ways. For example, the gate electrode 17 can be made of P-type platinum (Pt) so that the threshold voltage Vt2 of the MOSFET can be higher than the threshold voltage Vt1 of the IGBT by making the gate electrode.

It is preferable that the hole stopper layer 19 be located in the floating layer 18 at a shallow depth from the first surface 10*a* side of the semiconductor substrate 10. Alternatively, like the eighth and subsequent embodiments, the hole stopper layer 19 can be located in the base layer 11 at a deep depth.

In the above embodiments, the collector layer 23 is formed on the second surface 10*b* side of the semiconductor substrate 10 so that the insulated gate semiconductor device can have a vertical structure. Alternatively, the collector layer 23 can be formed on the first surface 10*a* side of the semiconductor substrate 10.

In the fifth embodiment, three floating layers 18 are located between two channel layers 13. Alternatively, four or more floating layers 18 can be located between two channel layers 13. That is, at least one floating layer 18 can be located between two floating layers 18. In such a case, the hole stopper layer 19 is formed in each floating layer 18 and spaced from the gate insulation layer 16 formed on the trench 12 that separates the floating layer 18 from an adjacent floating layer 18.

In the sixth embodiment, the P$^+$-type collector layer 23 is formed on the second surface 10*b* side of the semiconductor substrate 10 to provide a vertical RC-IGBT in which a portion of the collector layer 23 serves as the N$^+$-type cathode layer 28. Alternatively, the P$^+$-type collector layer 23 can be formed on the first surface 10*a* side of the semiconductor substrate 10 to provide a RC-IGBT.

The above embodiments can be achieved either independently or in combination.

What is claimed is:

1. An insulated gate semiconductor device comprising:
a first conductivity-type semiconductor substrate;
a second conductivity-type base layer formed on a first surface side of the semiconductor substrate;
a trench that penetrates the base layer and reaches the semiconductor substrate to divide the base layer into a first base layer and a second base layer, the trench having a predetermined longitudinal direction;
a first conductivity-type emitter region formed in the first base layer and in contact with a side surface of the trench in the first base layer;
a gate insulation layer formed on a surface of the trench;
a gate electrode formed on the gate insulation layer in the trench;
an emitter electrode electrically connected to the emitter region;
a second conductivity-type collector layer formed in the semiconductor substrate; and
a collector electrode formed on the collector layer, wherein the first base layer, where the emitter region is formed, serves as a channel layer,
the second base layer, where the emitter region is not formed, serves as a floating layer,
the emitter electrode is electrically connected to both the emitter region and the floating layer,
an impurity concentration of the floating layer is lower than an impurity concentration of the channel layer,
the floating layer has a first conductivity hole stopper layer that is located at a predetermined depth from the first surface of the semiconductor substrate and separated from the first surface of the semiconductor substrate, and
the hole stopper layer is at least partially spaced from the gate insulation layer.

2. The insulated gate semiconductor device according to claim 1, wherein
an area between the emitter electrode and the collector electrode, where a current flows in the channel layer, is configured to form an IGBT,
an area having a channel constructed with a portion of the floating layer between the gate insulation layer and the hole stopper layer between the emitter electrode and the collector electrode is configured to form a depletion-type MOSFET, and
a threshold voltage of the MOSFET is higher than a threshold voltage of the IGBT.

3. The insulated gate semiconductor device according to claim 1, wherein
the channel layer and the floating layer are repeatedly arranged in a predetermined pattern.

4. The insulated gate semiconductor device according to claim 1, wherein
the gate insulation layer formed on the side surface of the trench has a first portion and a second portion,
the first portion of the gate insulation layer is in contact with the floating layer and spaced from the hole stopper layer,
the second portion of the gate insulation layer is in contact with the emitter region in the channel layer, and
a thickness of the first portion of the gate insulation layer is larger than a thickness of the second portion of the gate insulation layer.

5. The insulated gate semiconductor device according to claim 1, wherein
the trench is formed in such a manner that the channel layer and the floating layer are repeatedly arranged in a predetermined pattern and that one floating layer is located between two channel layers,
the hole stopper layer is spaced from both the gate insulation layer formed on the side surface of the trench that separates the floating layer from one channel layer and the gate insulation layer formed on the side surface of the trench that separates the floating layer from the other channel layer, and
a thickness of each gate insulation layer is larger on the floating layer side than on the channel layer side.

6. The insulated gate semiconductor device according to claim 1 wherein
the trench is formed in such a manner that two flowing layers are located adjacent to each other between two channel layers,
the hole stopper layer is formed in each of the floating layers,
the hole stopper layer is in contact with the gate insulation layer formed on the side surface of the trench that separates the floating layer from the channel layer and spaced from the gate insulation layer formed on the side surface of the trench that separates the floating layers from each other, and a thickness of the gate insulation layer formed on the side surface of the trench that separates the floating layers from each other is larger than a thickness of the gate insulation layer formed on the side surface of the trench that separates the floating layer from the channel layer.

7. The insulated gate semiconductor device according to claim 6, wherein
the trench is formed in such a manner that another flowing layer is located between the two flowing layers, and
the hole stopper layer formed in the other flowing layer is spaced from the gate insulation layer formed on the trench that separates the other floating layer from the adjacent floating layer.

8. The insulated gate semiconductor device according to claim 1, wherein
a first gate voltage is applied to the gate electrode formed in the gate trench that separates the channel layer from the floating layer, and
a second gate voltage different from the first voltage is applied to the gate electrode formed in the gate trench that separates the floating layers from each other.

9. The insulated gate semiconductor device according to claim 1, wherein
the hole stopper layer is located on a bottom side of the trench in the floating layer in a depth direction of the trench,
the gate insulation layer has a first portion on the bottom side of the trench and a second portion on an opening side of the trench,
the first portion of the gate insulation layer is located at the depth and spaced from the hole stopper layer, and
the first portion of the gate insulation layer is thinker than the second portion of the gate insulation layer.

10. The insulated gate semiconductor device according to claim 9 wherein
the trench is formed in such a manner that the channel layer and the floating layer are repeatedly arranged in a predetermined pattern and that one floating layer is located between two channel layers, and
the hole stopper layer is spaced from both the gate insulation layer formed on the side surface of the trench that separates the floating layer from one channel layer and the gate insulation layer formed on the side surface of the trench that separates the floating layer from the other channel layer.

11. The insulated gate semiconductor device according to claim 10, wherein the channel layer has a first conductivity hole stopper layer that is located at the depth from the first surface of the semiconductor substrate and separated from the first surface of the semiconductor substrate, and the hole stopper layer of the channel layer is at least partially spaced from the first portion of the gate insulation layer.

12. The insulated gate semiconductor device according to claim 9 wherein a depth of the channel layer is less than a depth of the floating layer in the depth direction of the trench, and the second portion of the gate insulation layer is located at the depth of the channel layer.

13. The insulated gate semiconductor device according to claim 9 wherein the trench is formed in such a manner that two flowing layers are located adjacent to each other between two channel layers, the hole stopper layer is formed in each of the floating layers, and the hole stopper layer is in contact with the second portion of the gate insulation layer formed on the side surface of the trench that separates the floating layer from the channel layer and spaced from the first portion of the gate insulation layer formed on the side surface of the trench that separates the floating layers from each other.

14. The insulated gate semiconductor device according to claim 1, wherein the channel layer has a first conductivity hole stopper layer that is separated from the first surface of the semiconductor substrate, the hole stopper layer of the channel layer is located at a depth, from the first surface of the semiconductor substrate, where the first portion of the gate insulation layer is located, and spaced from the first portion of the gate insulation layer, and the hole stopper layer of the floating layer is in contact with the first portion of the gate insulation layer.

15. The insulated gate semiconductor device according to claim 1 wherein
at least one gate electrode has a double gate structure including a first gate electrode and a second gate electrode,
the first gate electrode is located on a bottom side of the trench and made of a second conductivity-type semiconductor material,
the second gate electrode is located on an opening side of the trench and located above the first gate electrode through a portion of the gate insulation layer, and
the first gate electrode is located at the depth where the hole stopper layer is spaced from the gate insulation layer.

16. The insulated gate semiconductor device according to claim 15, wherein
the trench is formed in such a manner that the channel layer and the floating layer are repeatedly arranged in a predetermined pattern and that one floating layer is located between two channel layers, and
the hole stopper layer is spaced from both the gate insulation layer formed on the side surface of the trench that separates the floating layer from one channel layer and the gate insulation layer formed on the side surface of the trench that separates the floating layer from the other channel layer.

17. The insulated gate semiconductor device according to claim 15, wherein
each gate electrode has the double gate structure including the first gate electrode and the second gate electrode,
the channel layer and the floating layer are repeatedly arranged in a predetermined pattern so that one floating layer is located between two channel layers,
the second gate electrode is located at the depth where the hole stopper layer is located, and
the hole stopper layer is in contact with both the gate insulation layer formed on the side surface of the trench that separates the floating layer from one channel layer and the gate insulation layer formed on the side surface of the trench that separates the floating layer from the other channel layer.

18. The insulated gate semiconductor device according to claim 15, wherein
the channel layer has a first conductivity hole stopper layer that is separated from the first surface of the semiconductor substrate, and
the hole stopper layer of the channel layer is located at a depth, from the first surface of the semiconductor substrate, where the first gate electrode is located.

19. The insulated gate semiconductor device according to claim 1 wherein
the gate electrode has a double gate structure including a first gate electrode and a second gate electrode,
the first gate electrode is located on a bottom side of the trench and made of a second conductivity-type semiconductor material, the second gate electrode is located on an opening side of the trench and located above the first gate electrode through a portion of the gate insulation layer, the trench is formed in such a manner that two flowing layers are located adjacent to each other between two channel layers, the hole stopper layer is formed in each of the floating layers, the hole stopper layer is in contact with the gate insulation layer formed on the side surface of the trench that has only the second gate electrode and separates the floating layer from the channel layer, and the hole stopper layer is spaced from the gate insulation layer formed on the side surface of the trench that has both the first gate electrode and the second gate electrode and separates the floating layers from each other.

20. The insulated gate semiconductor device according to claim 1 wherein the trench is formed in such a manner that two flowing layers are located adjacent to each other between two channel layers, the hole stopper layer is formed in each of the floating layers, the hole stopper layer is in contact with both the gate insulation layer formed on the side surface of the trench that separates the floating layer from the channel layer and the gate insulation layer formed on the side surface of the trench that separates the floating layers from each other, and a negative bias or a potential of the emitter electrode is applied to the gate electrode of the trench that separates the floating layers from each other.

21. The insulated gate semiconductor device according to claim 1 further comprising:

a second conductivity-type contact layer located on a surface portion of the floating layer and having a higher impurity concentration than the floating layer, wherein the contact layer is electrically connected to the emitter electrode.

22. The insulated gate semiconductor device according to claim 1 wherein a portion of the collector layer is configured as a first conductivity-type cathode layer, an area where the collector layer is formed in a surface direction of the first surface of the semiconductor substrate is configured as an IGBT element, and an area where the cathode layer is formed in the surface direction of the first surface of the semiconductor substrate is configured as a diode element.

23. The insulated gate semiconductor device according to claim 1 wherein an impurity concentration of the floating layer is less than $4 \times 10^{17}$ cm$^3$ on the first surface side of the semiconductor substrate with respect to the hole stopper layer.

24. The insulated gate semiconductor device according to claim 1 wherein a portion of the floating layer is formed between the hole stopper layer and the first surface side of the semiconductor substrate, and an impurity concentration of the portion of the floating layer is lower than the impurity concentration of the channel layer.

25. An insulated gate semiconductor device comprising:
a first conductivity-type semiconductor substrate;
a second conductivity-type base layer formed on a first surface side of the semiconductor substrate and configured to serve as a channel;

a trench that penetrates the base layer and reaches the semiconductor substrate to divide the base layer into multiple base layers, the trench having a predetermined longitudinal direction;

a first conductivity-type emitter region formed in part of the base layers and in contact with a side surface of the trench in the first base layer;

a gate insulation layer formed on a surface of the trench;

a gate electrode formed on the gate insulation layer in the trench; an emitter electrode electrically connected to the emitter region;

a second conductivity-type collector layer formed in the semiconductor substrate; and a collector electrode formed on the collector layer, wherein the base layer includes a second conductivity-type upper layer, a second conductivity-type lower layer, and a first conductivity-type hole stopper layer, the upper layer is located on the first surface side of the semiconductor substrate, the emitter region is formed in the upper layer, the lower layer is located under the upper layer and has a lower impurity concentration than the upper layer, and the hole stopper layer is formed in the lower layer at a predetermined depth from an interface between the upper layer and the lower layer and at least partially spaced from the gate insulation layer.

26. The insulated gate semiconductor device according to claim 25, wherein an area between the emitter electrode and the collector electrode, where a current flows in the channel layer, acts as an IGBT, an area having a channel constructed with a portion of the base layer between the gate insulation layer and the hole stopper layer between the emitter electrode and the collector electrode acts as a depletion-type MOSFET, and a threshold voltage of the MOSFET is higher than a threshold voltage of the IGBT.

27. The insulated gate semiconductor device according to claim 25, wherein the gate insulation layer has a first portion and a second portion, the first portion of the gate insulation layer is located at the depth in a depth direction of the trench and spaced from the hole stopper layer, the second portion of the gate insulation layer is located on an opening side of trench, and the first portion of the gate insulation layer is thinker than the second portion of the gate insulation layer.

28. The insulated gate semiconductor device according to claim 25, wherein the gate insulation layer formed on one of adjacent trenches is thicker than the gate insulation layer formed on the other of adjacent trenches, the emitter region is in contact with the gate insulation layer formed on the other of adjacent trenches, and the hole stopper layer is in contact with the gate insulation layer formed on the other of adjacent trenches and spaced from the gate insulation layer formed on the one of adjacent trenches.

29. The insulated gate semiconductor device according to claim 25, wherein the emitter region is spaced from the gate insulation layer formed on one of adjacent trenches and in contact with the gate insulation layer formed on the other of adjacent trenches, the hole stopper layer is in contact with each of the gate insulation layer formed on the one of adjacent trenches and the gate insulation layer formed on the other of adjacent trenches, the gate electrode of the one of adjacent trenches is separate from the gate electrode of the other of adjacent trenches, and a negative bias or a potential of the emitter electrode is applied to the gate electrode of the one of adjacent trenches.

30. The insulated gate semiconductor device according to claim 25, wherein the base layer has a second conductivity-type body region having a higher impurity concentration than the base layer on a surface portion of the base layer, a portion of the body region is formed along an extension direction of the trench, a remaining portion of the body region is formed along a direction perpendicular to the extension direction of the trench and in contact with the gate insulation layer of an adjacent trench in the middle of the extension direction of the trench, the remaining portion of the body region is deeper than the emitter region, the hole stopper layer is formed along the extension direction of the trench, and an end of the hole stopper layer is terminated below the body region.

31. The insulated gate semiconductor device according to claim 25, wherein at least one gate electrode has a double gate structure including a first gate electrode and a second gate electrode, the first gate electrode is located on a bottom side of the trench and made of a second conductivity-type semiconductor material, the second gate electrode is located on an opening side of the trench and located above the first gate electrode through a portion of the gate insulation layer, a depth of the base layer is less than a depth of the second gate electrode from the first surface side of the semiconductor substrate, and a portion of the base layer located in the middle of an extension direction of the trench is located at a depth where the first gate electrode is located.

32. The insulated gate semiconductor device according to claim 31, wherein each gate electrode has the double gate structure including the first gate electrode and the second gate electrode.

33. The insulated gate semiconductor device according to claim 31, wherein a potential of the second gate electrode, a negative bias, or a potential of the emitter electrode is applied to the first gate electrode.

* * * * *